US010937823B2

(12) United States Patent
Narui et al.

(10) Patent No.: US 10,937,823 B2
(45) Date of Patent: Mar. 2, 2021

(54) IMAGE-CAPTURING ELEMENT MANUFACTURING METHOD, IMAGE-CAPTURING ELEMENT AND IMAGE-CAPTURING DEVICE

(71) Applicant: NIKON CORPORATION, Tokyo (JP)

(72) Inventors: Tadashi Narui, Sagamihara (JP); Toru Takagi, Fujisawa (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/823,673

(22) Filed: Mar. 19, 2020

(65) Prior Publication Data
US 2020/0219923 A1  Jul. 9, 2020

Related U.S. Application Data

(60) Division of application No. 16/049,024, filed on Jul. 30, 2018, now Pat. No. 10,636,830, which is a
(Continued)

(30) Foreign Application Priority Data

Feb. 1, 2016 (JP) .............................. JP2016-017483

(51) Int. Cl.
*H01L 27/146* (2006.01)
*H04N 5/369* (2011.01)
(Continued)

(52) U.S. Cl.
CPC ...... *H01L 27/14634* (2013.01); *H01L 27/146* (2013.01); *H01L 27/1464* (2013.01);
(Continued)

(58) Field of Classification Search
CPC ......... H01L 27/146–1469; H01L 21/78; H01L 27/14634
See application file for complete search history.

(56) References Cited

U.S. PATENT DOCUMENTS 7,333,146 B1  2/2008 Etoh
2009/0243051 A1  10/2009 Vanam
(Continued)

FOREIGN PATENT DOCUMENTS

JP     2001-169191      6/2001
JP     2006345330 A  * 12/2006
(Continued)

OTHER PUBLICATIONS

Japanese Office Action dated Jul. 30, 2019 in corresponding Japanese Patent Application No. 2017-565558.
(Continued)

*Primary Examiner* — Alia Sabur
(74) *Attorney, Agent, or Firm* — Staas & Halsey LLP

(57) ABSTRACT

An image-capturing element manufacturing method includes: preparing a first substrate having a plurality of pixels that are two-dimensionally continuously arrayed; preparing a second substrate having a plurality of circuit blocks that respectively have connection terminals to a power supply and a reference potential and that are electrically independent from each other, each of the plurality of circuit blocks having at least some of circuits to read out signals from the plurality of pixels; laminating the first substrate and the second substrate to electrically couple the plurality of circuit blocks and the plurality of pixels overlapping therewith; and cutting circuit blocks around at least one of the plurality of circuit blocks and pixels overlapping therewith to form a laminate in which the plurality of pixels are laminated onto the at least one of the plurality of circuit blocks.

8 Claims, 22 Drawing Sheets

Related U.S. Application Data continuation of application No. PCT/JP2017/003393, filed on Jan. 31, 2017.

(51) Int. Cl.
  *H04N 5/378* (2011.01)
  *H04N 5/347* (2011.01)
  *H04N 7/18* (2006.01)

(52) U.S. Cl.
  CPC .... *H01L 27/1469* (2013.01); *H01L 27/14621* (2013.01); *H01L 27/14627* (2013.01); *H01L 27/14636* (2013.01); *H01L 27/14643* (2013.01); *H01L 27/14685* (2013.01); *H04N 5/347* (2013.01); *H04N 5/378* (2013.01); *H04N 5/379* (2018.08); *H04N 7/183* (2013.01)

(56) References Cited

U.S. PATENT DOCUMENTS

| | | | |
|---|---|---|---|
| 2010/0025710 A1 | 2/2010 | Yamada et al. | |
| 2014/0240566 A1* | 8/2014 | Shizukuishi | H01L 27/14634 348/302 |
| 2016/0190204 A1 | 6/2016 | Chiu | |

FOREIGN PATENT DOCUMENTS

| | | |
|---|---|---|
| JP | 2008/084646 A1 | 7/2008 |
| JP | 2010-40672 | 2/2010 |
| JP | 2010192837 A | 9/2010 |
| JP | 2010-225927 | 10/2010 |
| JP | 2014-3069 | 1/2014 |
| JP | 2014-30170 | 2/2014 |

OTHER PUBLICATIONS

International Search Report dated Apr. 4, 2017 in corresponding International Patent Application No. PCT/JP2017/003393.
U.S. Restriction Requirement dated Jun. 26, 2019 in U.S. Appl. No. 16/049,024.
U.S. Office Action dated Sep. 10, 2019 in U.S. Appl. No. 16/049,024.
U.S. Notice of Allowance dated Feb. 27, 2020 in U.S. Appl. No. 16/049,024.
U.S. Appl. No. 16/049,024, filed Jul. 30, 2018, Tadashi Narui, Nikon Corporation.

* cited by examiner

IMAGE-CAPTURING ELEMENT MANUFACTURING METHOD, IMAGE-CAPTURING ELEMENT AND IMAGE-CAPTURING DEVICE

This application is a Divisional Application of U.S. patent application Ser. No. 16/049,024 filed on Jul. 30, 2018. The contents of the following Japanese and International patent applications are incorporated herein by reference:
NO. 2016-017483 filed on Feb. 1, 2016, and
NO. PCT/JP2017/003393 filed on Jan. 31, 2017.

BACKGROUND

1. Technical Field

The present invention relates to an image-capturing element manufacturing method, an image-capturing element and an image-capturing device.

2. Related Art

There is an image-capturing element having a structure in which a substrate having light-receiving elements and a substrate having readout circuits are laminated one on another (please see Patent Document 1, for example).
Patent Document 1: Japanese Patent Application Publication No. 2010-225927

If image-capturing elements with different numbers of pixels are to be manufactured, dedicated pixels and pixel readout circuits are designed, and masks corresponding to them are used to fabricate substrates so that the manufacturing cost has become high.

GENERAL DISCLOSURE

A first aspect of the present invention provides an image-capturing element manufacturing method including: preparing a first substrate having a plurality of pixels that are two-dimensionally continuously arrayed; preparing a second substrate having a plurality of circuit blocks that respectively have connection terminals to a power supply and a reference potential and that are electrically independent from each other, each of the plurality of circuit blocks having at least some of circuits to read out signals from the plurality of pixels; laminating the first substrate and the second substrate to electrically couple the plurality of circuit blocks and the plurality of pixels overlapping therewith; and cutting circuit blocks around at least one of the plurality of circuit blocks and pixels overlapping therewith to form a laminate in which the plurality of pixels are laminated onto the at least one of the plurality of circuit blocks.

A second aspect of the present invention provides an image-capturing element including: a first substrate having a plurality of pixels that are two-dimensionally continuously arrayed; and a second substrate that is laminated onto the first substrate and has a plurality of circuit blocks including at least some of circuits to read out signals from the plurality of pixels laminated corresponding to respective regions, wherein the plurality of circuit blocks respectively have connection terminals to a power supply and a reference potential and are electrically independent from each other.

A third aspect of the present invention provides the image-capturing device including the above-mentioned image-capturing element.

The summary clause does not necessarily describe all necessary features of the embodiments of the present invention. The present invention may also be a sub-combination of the features described above.

BRIEF DESCRIPTION OF THE DRAWINGS

FIG. 17 is a flow diagram illustrating a procedure of manufacturing laminate blocks 430 or the like.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
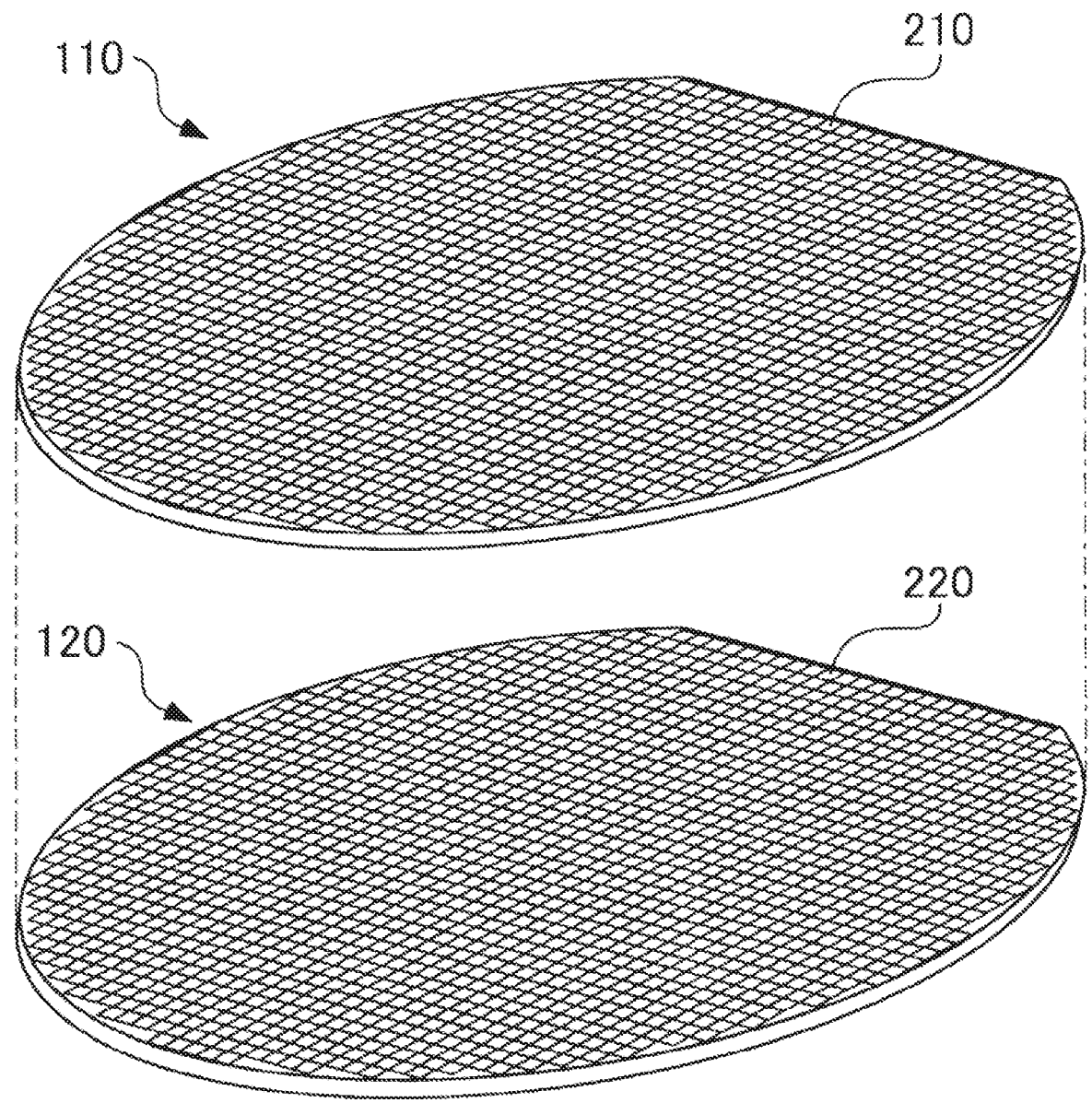
FIG. 1 is a schematic perspective view of a first substrate 110 and a second substrate 120.

FIG. 1 is a schematic perspective view of a first substrate 110 and a second substrate 120 that are laminated to constitute an image-capturing element. The first substrate 110 positioned on the upper side in the figure and the second substrate 120 positioned on the lower side in the figure are semiconductor substrates having approximately the same dimensions. Semiconductor substrates mentioned here may be semiconductor substrates on which elements, wires or the like are formed by photolithography, for example.

The first substrate 110 has a plurality of two-dimensionally arrayed pixel blocks 210. The plurality of pixel blocks 210 have the same size, and are arranged continuously adjacent to each other, with no gaps such as a dicing line being provided therebetween. In addition, the pixel blocks 210 are disposed in a region of the first substrate 110 which can be processed by photolithography entirely. Although in the embodiment, the first substrate 110 has the plurality of pixel blocks 210, as mentioned below, a configuration may be adopted in which a plurality of pixel cells 217 that are two-dimensionally arrayed in the first substrate 110 are not partitioned into the pixel blocks 210.

The second substrate 120 has a plurality of two-dimensionally arrayed circuit blocks 220. The plurality of circuit blocks 220 have the same size, and are arranged adjacent to each other. The circuit blocks 220 are disposed in a region of the second substrate 120 which can be processed by photolithography entirely.

Figure 2:
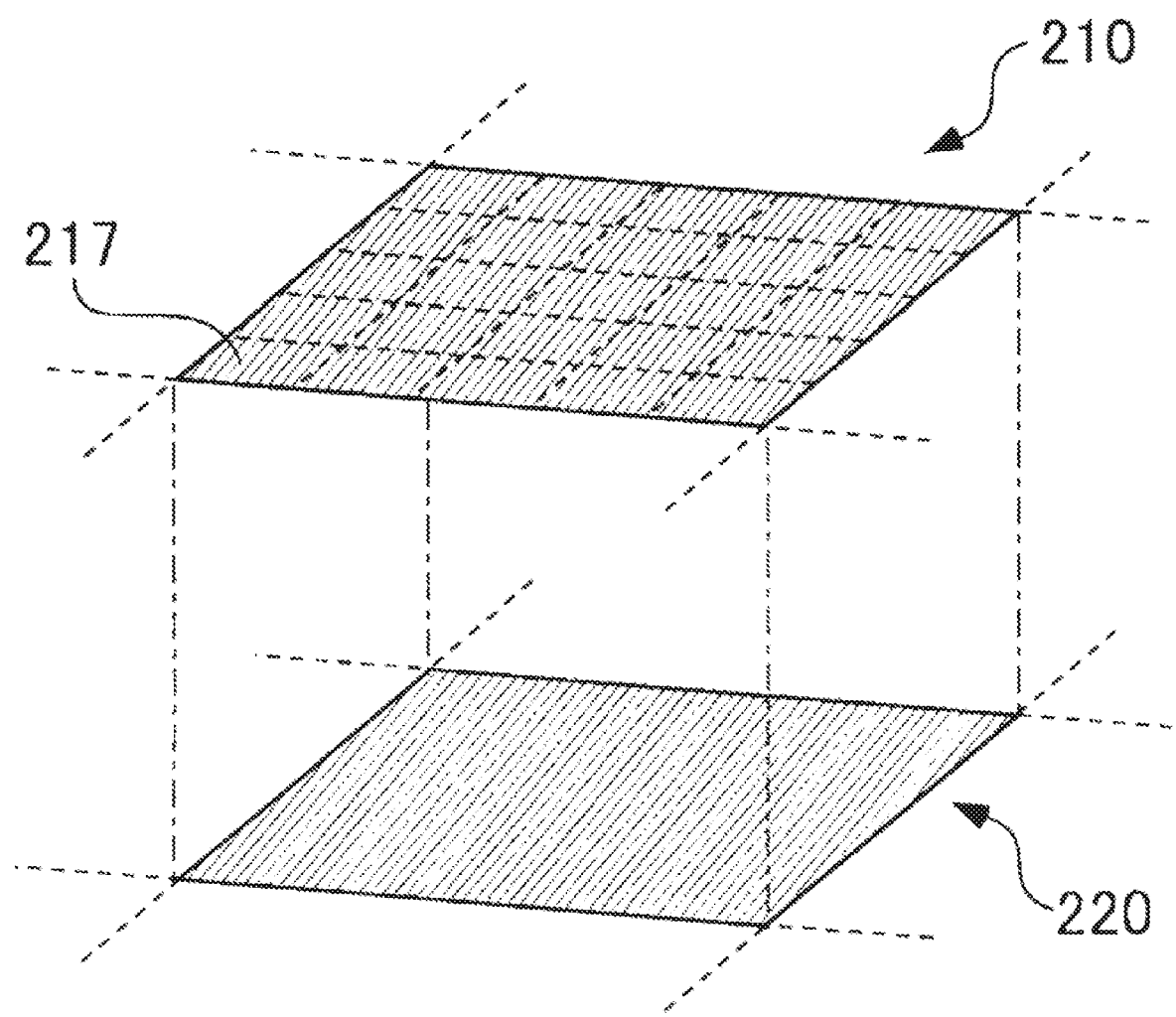
FIG. 2 is a schematic view of a pixel block 210 and a circuit block 220.

FIG. 2 is a schematic view showing the correspondence between a pixel block 210 of the first substrate 110 and a circuit block 220 of the second substrate 120. Each of the circuit blocks 220 in the second substrate 120 is disposed in a region corresponding to each of the pixel blocks 210 in the first substrate 110. In addition, the pixel block 210 and the circuit block 220 have the same size.

In the first substrate 110, each of the pixel blocks 210 has a plurality of two-dimensionally arrayed pixel cells 217. Each of the plurality of pixel cells 217 includes a light-receiving element. In addition, a predetermined number of pixel cells 217 are disposed in each of the plurality of pixel blocks 210. Such pixel blocks 210 may be disposed in the first substrate 110 in an approximately 100-by-100 to 1000-by-1000 matrix for example, if the pitches of the pixel cells 217 are approximately 1 micrometer to several micrometers.

Although in the first substrate 110, a pixel block 210 needs not necessarily closely contact an adjacent pixel block 210, the interval therebetween may be one that makes the pitches of the pixel cells 217 unchanged even between the adjacent pixel blocks 210, for example. Because in this case, the pitches of the pixel cells 217 in the first substrate 110 are all equal to each other, the pixel cells 217 need not be partitioned into the pixel blocks 210 in the first substrate 110 if a configuration is adopted in which wires to connect the pixel cells 217 are arranged in circuit blocks of the second substrate 120 and there are no wires connecting the pixel cells 217, that is, in which each pixel cells 217 is independent. In addition, for example if the pixel blocks 210 are formed by photolithography, gaps may be generated between the pixel blocks 210, the gaps having sizes approximately corresponding to the interval of exposure after a mask is moved and not as wide as dicing lines or scribe lines, for example the gaps having widths corresponding to approximately several pixels. Thereby, it is possible to reduce the number of pixels to be destroyed by dicing, by cutting a region including the gaps when the first substrate 110 is diced.

In the second substrate 120, the plurality of circuit blocks 220 have circuits having the same configuration. The circuits disposed in circuit blocks 220 include at least some of readout circuits to read out output signals of pixel cells 217 disposed in corresponding pixel blocks 210.

Figure 3:
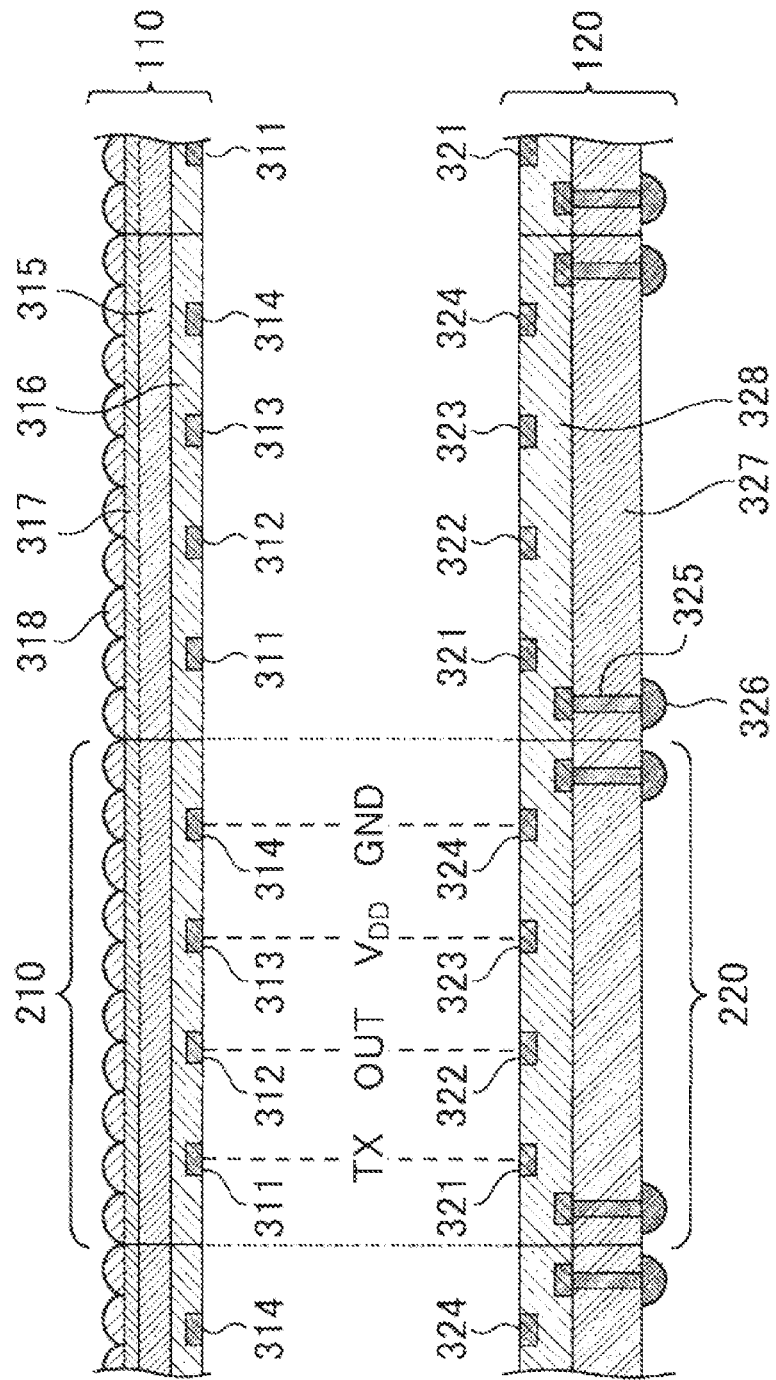
FIG. 3 is a schematic view showing the state before lamination of the first substrate 110 and the second substrate 120.
Figure 4:
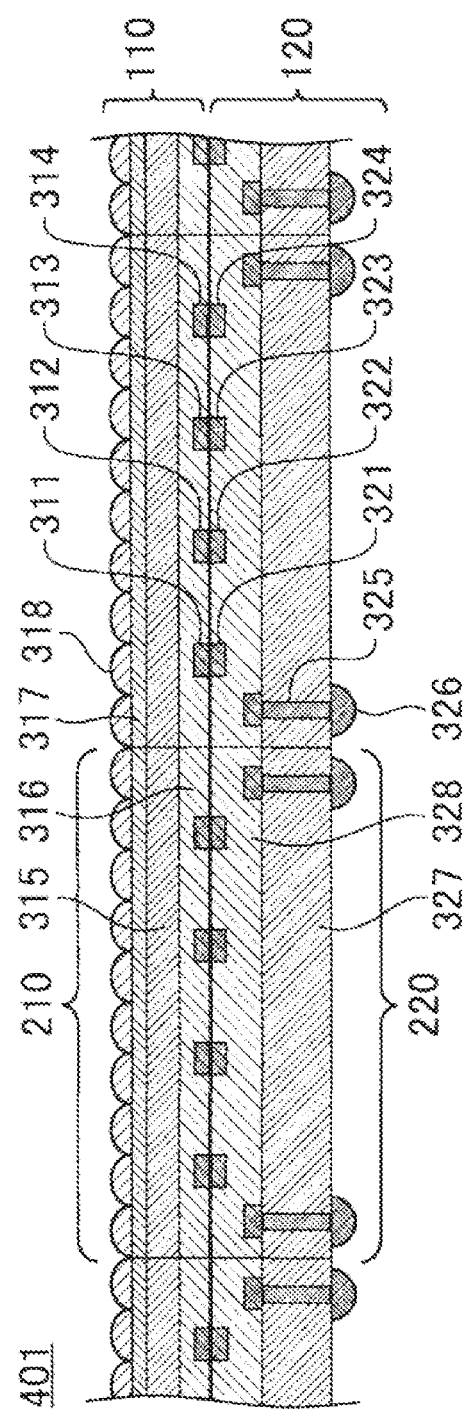
FIG. 4 is a schematic view showing the state where the first substrate 110 and the second substrate 120 are laminated.

FIG. 3 is a sectional view schematically showing the structures of a pixel block 210 in the first substrate 110 and a circuit block 220 in the second substrate 120 together. FIG. 4 is a schematic view showing electrical connections that are established when the first substrate 110 and the second substrate 120 are laminated. When the first substrate 110 and the second substrate 120 are positioned to face each other, each of the pixel blocks 210 and a corresponding one of the circuit blocks 220 are aligned.

In the illustrated example, the first substrate 110 is a back-side illumination substrate, and an underlying substrate 315 having a circuit layer 316 formed on the lower surface in the figure is made thin from its rear surface. On the upper surface, in the figure, of the underlying substrate 315 that is made thin, a color filter 317 and a micro lens array 318 are laminated sequentially. In the first substrate 110, other pixel blocks 210 are present on both sides of and adjacent to the pixel block 210 in the figure.

In this embodiment, the underlying substrate 315 is made thin after the first substrate 110 and the second substrate 120 are laminated. However, a different procedure may be adopted in which the first substrate 110 and the second substrate 120 are laminated after the underlying substrate 315 is made thin before the lamination. In addition, pixel cells 217 implemented in the first substrate 110 are not limited to back-side illumination cells. For example, they may be front-side illumination cells and connected to a circuit substrate using TSVs (through-vias).

The second substrate 120 positioned on the lower side in the figure has connection pads 321, 322, 323, 324 on its upper surface in the figure. The connection pads 321, 322, 323, 324 are disposed at positions at which they face connection pads 311, 312, 313, 314 of the first substrate 110. In addition, the second substrate 120 has a plurality of TSVs (through-silicon vias) 325 and a plurality of bumps 326 that are disposed on the lower surface in the figure. Although the upper surface of the second substrate 120 is provided with circuits formed by photolithography, illustration thereof is omitted.

The TSVs 325 penetrate the second substrate 120 in the thickness direction to electrically couple the front and rear of the second substrate 120. The bumps 326 are used when circuits on the upper surface, in the figure, of the second substrate 120 are connected to the outside through the TSVs 325.

Other circuit blocks 220 are present also on both sides of and next to the circuit block 220 in the figure. The plurality of circuit blocks 220 have the same structure. Because of this, connection pads 324, 321 of adjacent circuit blocks 220 are seen in the figure.

The circuit layer 316 of the first substrate 110 constitutes a part of the pixel block 210. The pixel block 210 has a plurality of the connection pads 311, 312, 313, 314 on the lower surface of the circuit layer 316 in the figure. A circuit layer 328 of the second substrate 120 constitutes a part of the circuit block 220. The circuit block 220 has a plurality of the connection pads 321, 322, 323, 324 on the upper surface of the circuit layer 328 in the figure.

When the first substrate 110 and the second substrate 120 are laminated one on another, the connection pads 311, 312, 313, 314 of the first substrate 110 and the connection pads 321, 322, 323, 324 of the second substrate 120 come into contact with each other and become electrically coupled with each other. Thereby, a selection signal TX and a power supply voltage VDD are supplied from the second substrate 120 to the first substrate 110 through the connection pads 311, 313, 321, 323. In addition, an output signal OUT is output from the first substrate 110 to the second substrate 120 through the connection pads 312, 322. Furthermore, a reference potential GND of the first substrate 110 and the second substrate 120 is made common to them through the connection pads 314, 324, and the pixel block 210 and the circuit block 220 form an integrated image-capturing element.

If the first substrate 110 is not partitioned into pixel blocks 210, but pixel cells 217 are arrayed over its entire surface, each pixel cell 217 is provided with connection pads 311, 312, 313, 314. Furthermore, corresponding to them, the connection pads 321, 322, 323, 324, the number of which is equal to the number of the pixel cells 217, are also provided to the second substrate 120. Thereby, because there are no wires that cross respective pixel cells 217, in the first substrate 110, even if any pixel cell 217 itself is cut, pixel cells 217 adjacent thereto operate normally. That is, even if pixel blocks 210 are not set in the first substrate 110, pixel cells 217 in an image-capturing element cut out operate normally by cutting any pixel cells 217 along the outer circumference of a circuit block 220.

Figure 5:
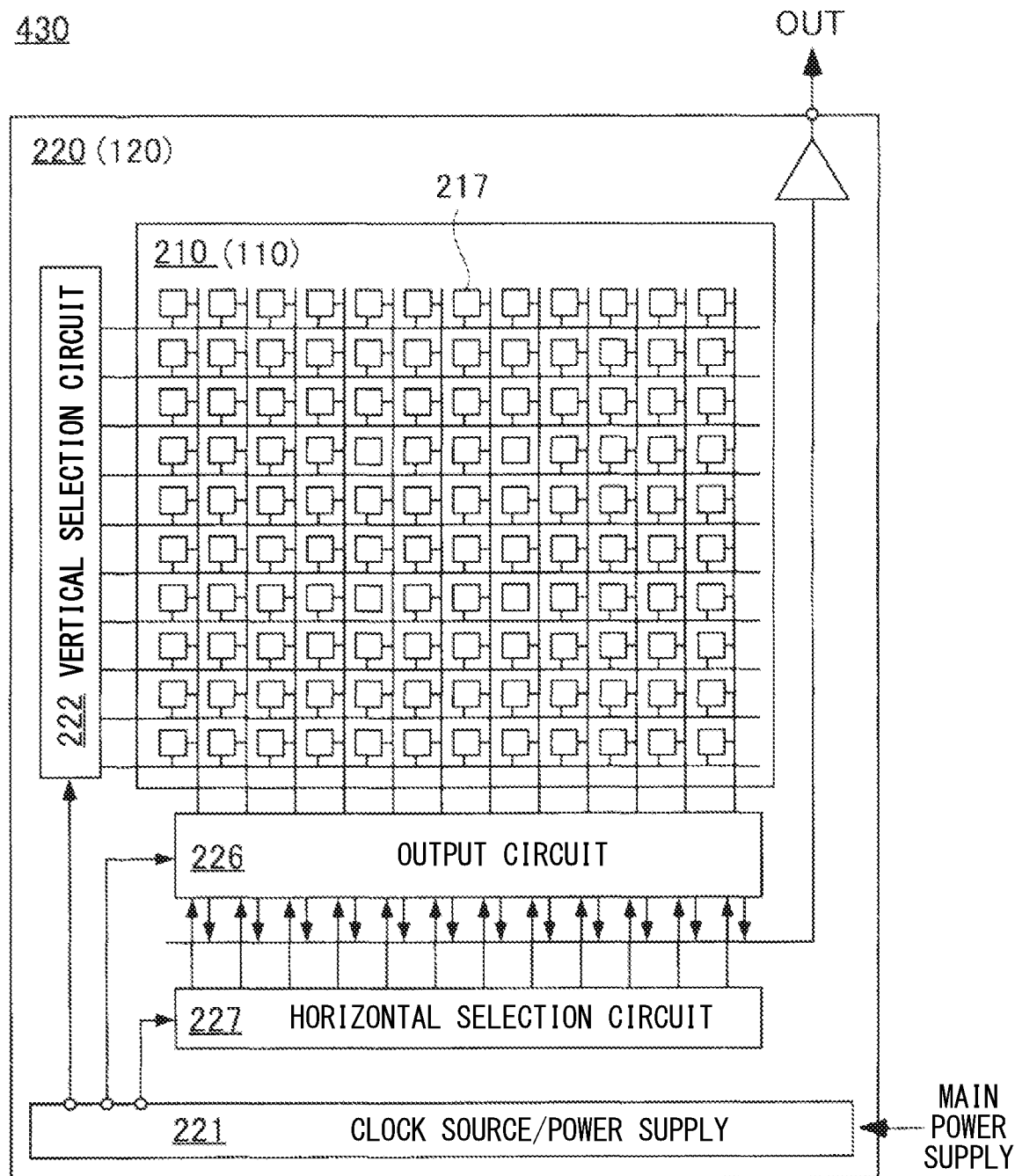
FIG. 5 is a block diagram of a laminate block 430.

FIG. 5 is a block diagram showing the electrical structure of a laminate block 430. The laminate block 430 is formed by a single pixel block 210 and a single circuit block 220 that are electrically couple to each other when the first substrate 110 and the second substrate 120 are laminated. The laminate block 430 has the pixel block 210 including a plurality of pixel cells 217, a vertical selection circuit 222, an output circuit 226, a horizontal selection circuit 227 and a clock source/power supply 221.

The pixel cells 217 include photoelectric converting elements such as photodiodes, and output electric signals corresponding to the intensity of incident light that they received to the circuit block 220.

The vertical selection circuit 222 is connected to the pixel cells 217, disposed in a matrix form, line by line by common wires. The output circuit 226 and horizontal selection circuit 227 are connected to one side which is different from a side connected to the vertical selection circuit 222.

The vertical selection circuit 222 includes a shift register, and sequentially selects a plurality of drive wires connected thereto to supply pulse signals to drive the pixel cells 217 to the selected drive wires. Thereby, the pixel cells 217 are sequentially selected and scanned line by line.

The output circuit 226 includes a correlated double sampling circuit, a load transistor, a column selecting transistor and the like, and is connected to the pixel cells 217 column by column. The horizontal selection circuit 227 is formed for example by a shift register, and is connected to the column selecting transistor in the output circuit 226. The horizontal selection circuit 227 sequentially drives the column selecting transistor of the output circuit 226 to sequentially select and scan the pixel cells 217 column by column through the output circuit 226.

A pixel cell 217 that is in a line selected and driven by the vertical selection circuit 222 and is selected and driven by the horizontal selection circuit 227 outputs, to the output circuit 226, a signal corresponding to an electrical charge stored in a capacitive element such as a floating diffusion layer by a light-receiving element. The output circuit 226 removes influence of pattern noises by correlated double sampling, and then sends out a signal corresponding to the intensity of light entering the pixel cell 217 to the outside of the laminate block 430.

Figure 6:
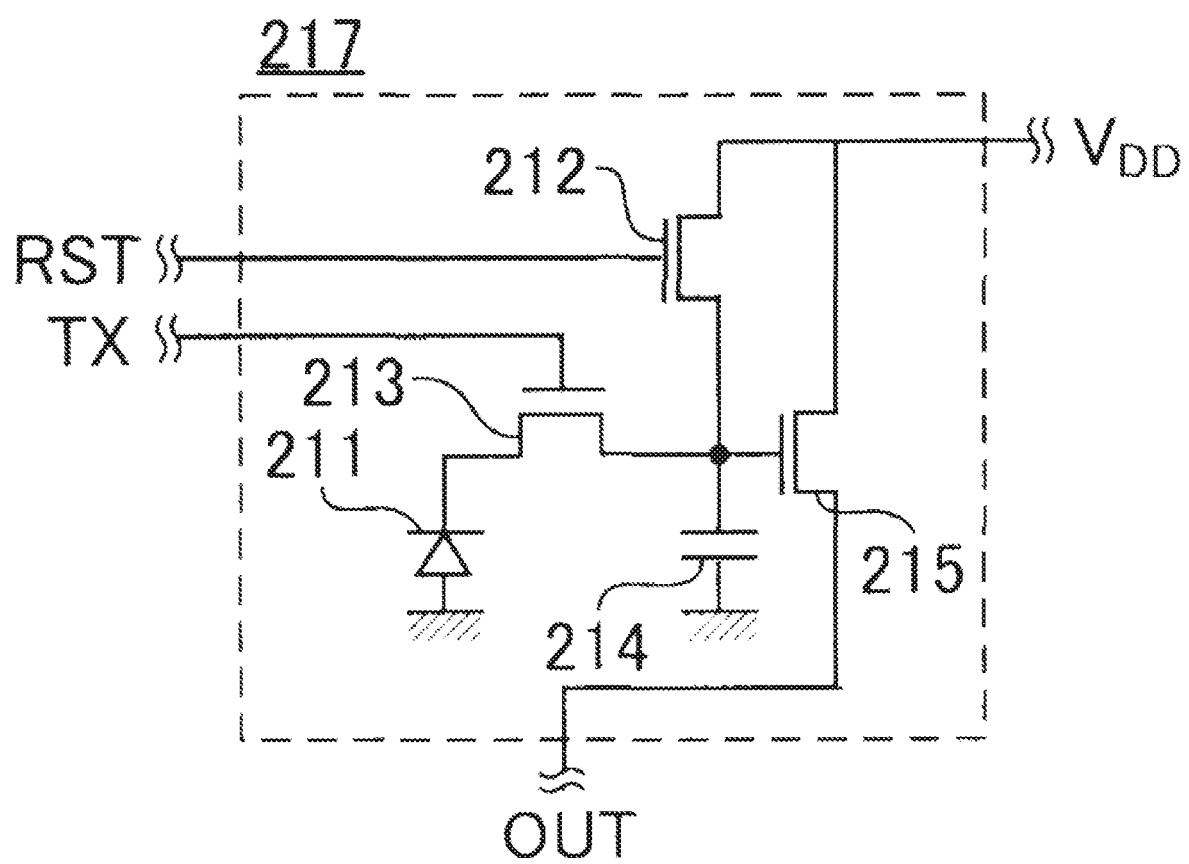
FIG. 6 is a circuit diagram showing the structure of a pixel cell 217.

FIG. 6 is a circuit diagram showing one of pixel cells 217 taken out of the laminate block 430. Each of the pixel cells 217 has a light-receiving element 211, a reset transistor 212, a transfer transistor 213, a capacitive element 214 and an amplifier transistor 215.

The pixel cell 217 stores, in the capacitive element 214, an electrical charge corresponding to the quantity of light received by the light-receiving element 211, by a selection signal TX received from the second substrate 120. In addition, a current corresponding to the stored electrical charge is supplied as an output signal OUT to the second substrate. In addition, the pixel cell 217 is supplied, from the second substrate 120, even with a power supply voltage $V_{DD}$ from a power supply.

Figure 7:
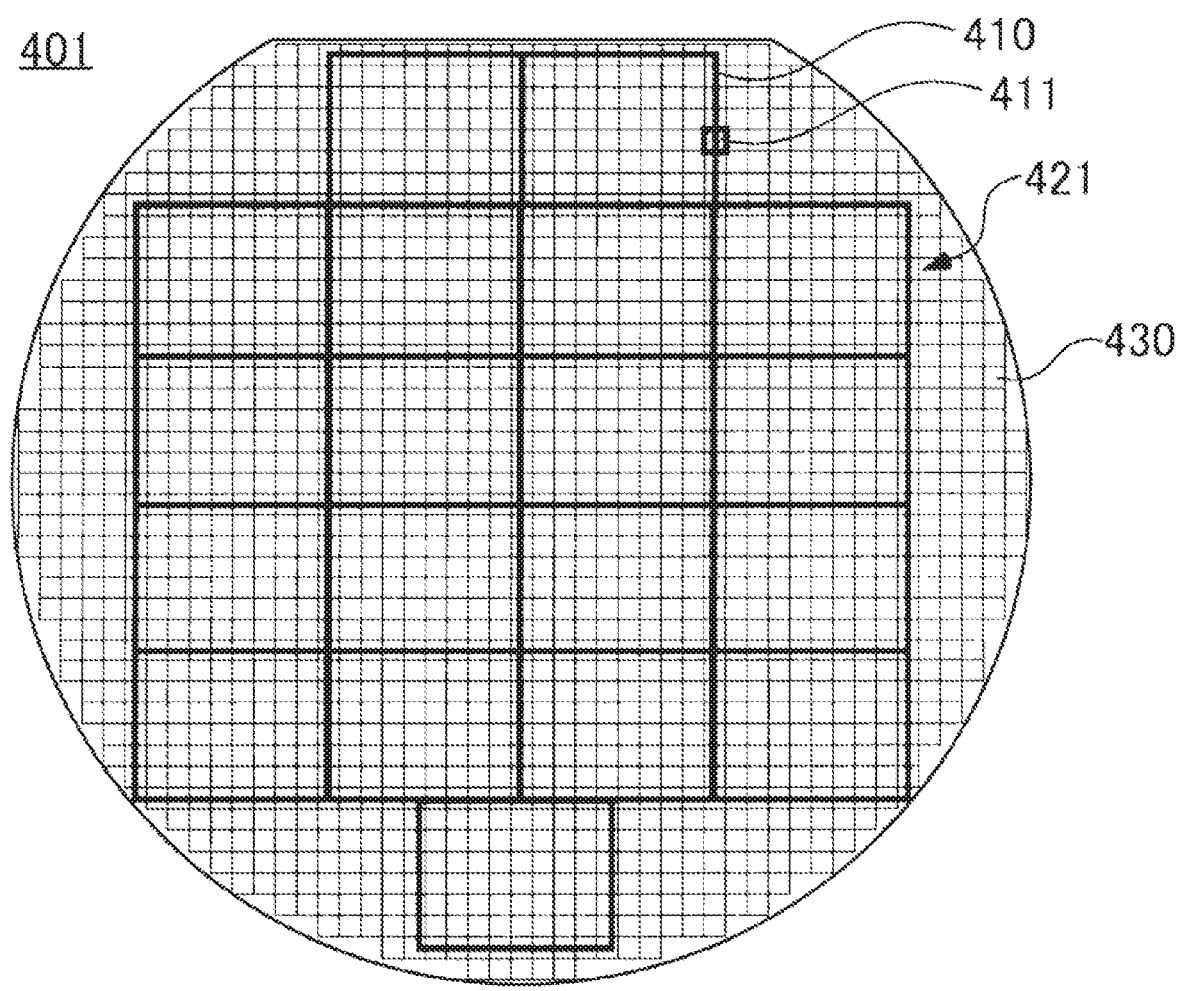
FIG. 7 is a figure schematically showing cut-out positions of image-capturing elements 421.

FIG. 7 is a schematic plan view of a laminate substrate 401. The laminate substrate 401 is formed by laminating the first substrate 110 and the second substrate 120.

In the illustrated example, the boundaries of pixel blocks 210 can be seen through the first substrate 110 in the laminate substrate 401. In the laminate substrate 401, a structure formed by laminating one of the pixel blocks 210 and a corresponding one of circuit blocks 220 is called a laminate block 430.

Although the laminate blocks 430 fill the approximately entire surface of the laminate substrate 401, as indicated with thick cut-out lines 410 in the figure, in the laminate substrate 401, an image-capturing element 421 which is a laminate of a part of the first substrate 110 and a part of the second substrate 120 can be cut out by cutting the outside of a region including at least one laminate block 430.

For example, if an image-capturing element 421 including laminate blocks 430 in a matrix of 30 (in the vertical direction) by 40 (in the horizontal direction) is cut out from the laminate substrate 401 having the laminate blocks 430 each including a 1-μm square of pixel cells 217 including 100×100 pixels, the number of pixels becomes 12 million. For example, assuming that the middles of blocks are cut out, the chip size of the image-capturing element 421 becomes approximately 3.1 mm×4.1 mm. In the example shown in FIG. 7, a plurality of image-capturing elements 421 to be cut out have the same area. Accordingly, the numbers of laminate blocks 430 included in individual image-capturing elements 421 are equal to each other, and the resolution of the image-capturing elements 421 is also equal to each other.

Here, if an image-capturing element 421 including at least one laminate block 430 is cut out from the laminate substrate 401, a laminate block 411 that is disposed along the outer circumference of the laminate block 430 and surrounds the laminate block 430, that is, a pixel block 210 itself and a circuit block 220 itself forming the laminate block 411 are cut. Thereby, the cut laminate block 411 no longer functions as a laminate block 430, but each of the laminate blocks 430 positioned inside cut-out lines 410 can surely operate as a part of the image-capturing element 421 because they are electrically independent of the cut laminate block 411. In this manner, image-capturing elements 421 of any sizes can be cut out at any positions in the laminate substrate 401.

As mentioned above, by cutting a laminate block 411 including a pixel block 210 itself and a circuit block 220 itself when cutting the laminate substrate 401 in order to cut out an image-capturing element 421, the function of other laminate blocks 430 adjacent to the laminate block 411 can be preserved. In addition, each of the laminate blocks 430 included in the image-capturing element 421 cut out has a pixel block 210 and a circuit block 220, and functions as a laminate block 430. Accordingly, by using a control unit that controls a plurality of laminate blocks 430 in parallel, an image-capturing element 421 including a plurality of laminate blocks 430, each of which operates as an image-capturing element, can be used as if it is a single image-capturing element.

In view of the aim not to damage adjacent laminate blocks 430 when cutting a laminate block 411 on a cut-out line 410, the width of the laminate block 411 may be made wider than the kerf of a tool to cut out an image-capturing element 421. Alternatively, an image-capturing element 421 may be cut out using a method or tool with a kerf narrower than the width of a laminate block 411. Specifically, a laser dicing apparatus, a stealth dicing apparatus, a plasma etching apparatus, a water later apparatus or the like can be used.

In addition, on the first substrate 110, after light-receiving elements to be pixels or the like are formed, members such as a wiring layer, a color filter or micro lenses are formed further. Here, if positions to be cut by dicing are known in advance, a dedicated mask can be used at at least one of steps to form a wiring layer, a color filter, micro lenses or the like. Thereby, scaling to change positions of micro lenses, a color filter and openings for wires of peripheral pixels becomes possible in order for light beams at peripheral portions to enter efficiently.

Accordingly, positions of the first substrate 110 to be cut by dicing may be determined prior to formation of members such as a wiring layer, a color filter or micro lenses. Stated differently, because the first substrate 110 on which pixels are formed can cope with different dicing patterns, a process of manufacturing laminate semiconductor apparatuses including pixels can be shortened if the first substrate 110 is prepared.

Furthermore, a step of shielding optical black pixels, for output of black reference to be used for correction, from light by a wiring layer, a black color filter, an RGB color filter or the like may be executed on the first substrate 110 before a dicing step. Thereby, elements that are capable of offset correction can be manufactured by disposing pixels for offset correction around pixels.

Still furthermore, a determined dicing pattern may be drawn on the first substrate 110 using a wire material by forming a wiring layer before dicing. Thereby, the work efficiency at a dicing step can be improved.

In addition, in the laminate substrate 401 formed by laminating the first substrate 110 and the second substrate 120, none of the boundaries of pixel blocks 210 and circuit blocks 220 formed on the respective substrates are exposed to outer surfaces of the first substrate 110 and the second substrate 120 in some cases. In such a case, a pixel block 210 to be cut itself or a circuit block 220 to be cut itself can be checked from the outside of the laminate substrate 401 through the first substrate 110 or second substrate 120 by irradiating the laminate substrate 401 with infrared light.

Figure 8:
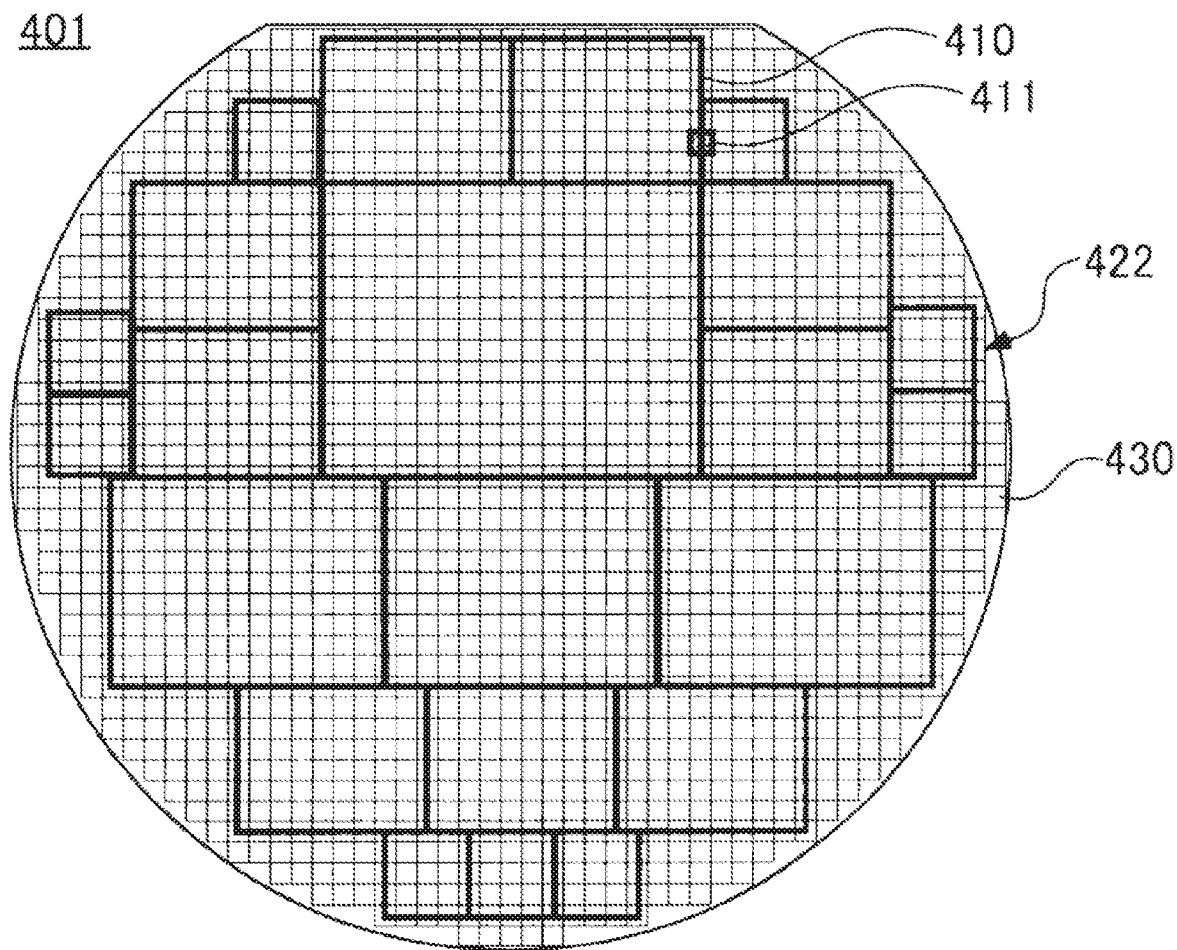
FIG. 8 is a figure schematically showing cut-out positions of image-capturing elements 422.

FIG. 8 is a figure schematically showing cut-out positions of other image-capturing elements 422 to be cut out from the laminate substrate 401. Because individual laminate blocks 430 can operate respectively independently as image-capturing elements in the laminate substrate 401, image-capturing element 422 with various shapes and sizes including mutually different numbers of laminate blocks 430 may be cut out from one laminate substrate 401. Thereby, a mask needs not be created for each specification of an image-capturing element 422 if a small quantity and large variety of image-capturing elements are to be manufactured, and development time can be shortened. Image-capturing elements 422 to be cut out may include those that are of the same size or specification, and furthermore it is needless to say that image-capturing elements 422 all conforming to the same specification may be cut out from one laminate substrate 401.

For example, in the above-mentioned example in which one pixel block 210 includes pixel cells 217 that are disposed at the pixel pitch of 1 μm in a matrix of 100×100, the sizes of image-capturing elements 422 to be cut out from the laminate substrate 401 can be chosen in units of 0.1 mm, from the laminate substrate 401. In addition, because image-capturing elements 422 to be cut out can be caused to include approximately several tens to several thousands pixel blocks 210, the resolution as image-capturing elements can be selected from within a wide range.

Furthermore, because the screen sizes as image-capturing elements 422 can be set to any sizes in units of pixel blocks 210, image-capturing elements 422 with different profiles such as 16:9, 3:2 or 1:1 can be manufactured from one laminate substrate 401. Furthermore, image-capturing elements 422 for different uses such as those for cameras, smartphones, microscopes or monitoring can be cut out from one laminate substrate 401.

Figure 9:
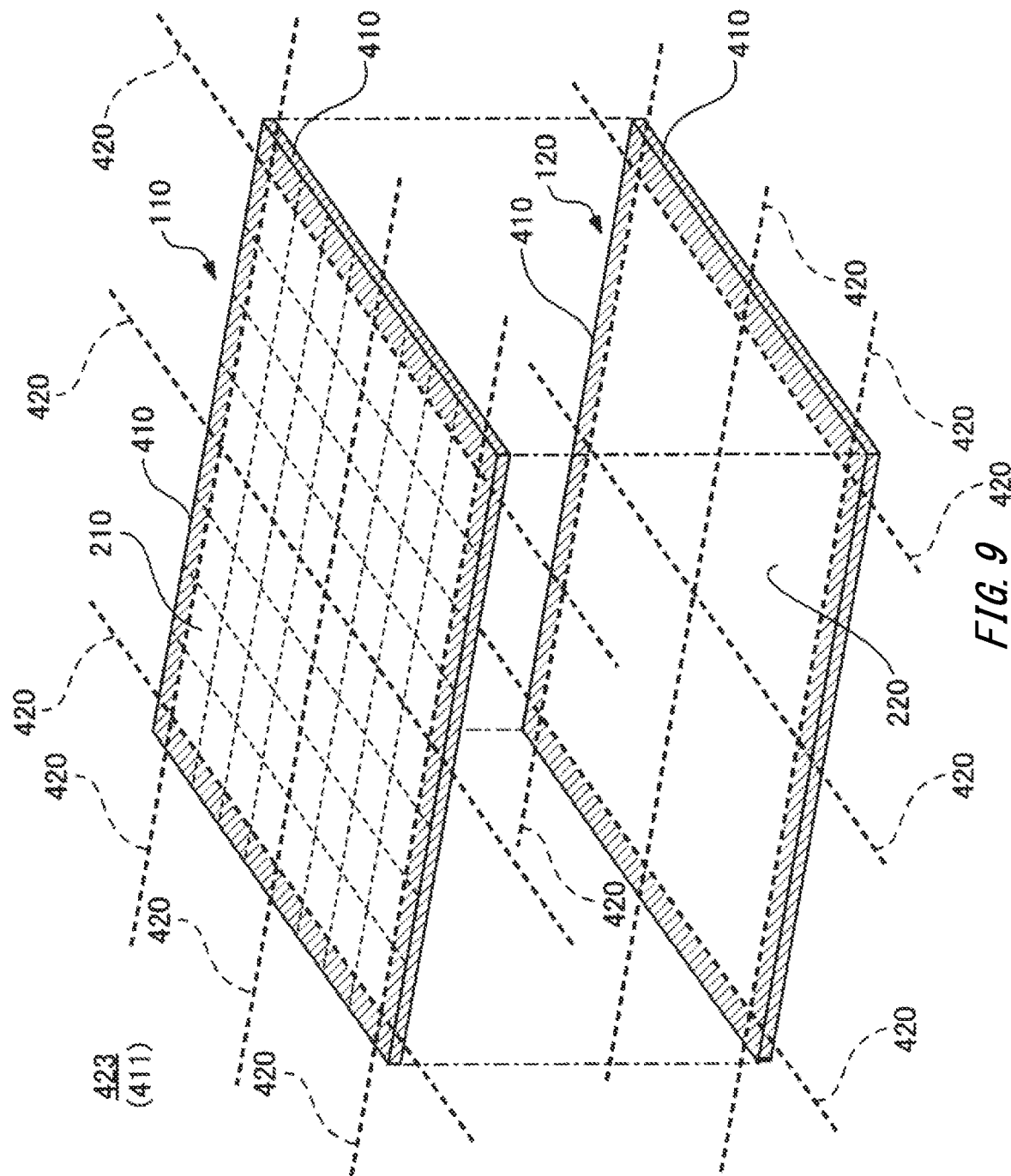
FIG. 9 is a schematic exploded perspective view of an image-capturing element 423.

FIG. 9 is a schematic exploded perspective view of an image-capturing element 423. In the illustrated image-capturing element 423, elements that are common to those in the sectional view of the first substrate 110 and second substrate 120 shown in FIG. 3 are given the same reference numbers, and the same explanations are not repeated.

The image-capturing element 423 cut out along cut-out lines 410 include a plurality of pixel blocks 210 and a plurality of circuit blocks 220 that are separated by boundaries 420. Here, the outermost circumferences of the plurality of pixel blocks 210 and plurality of circuit blocks 220 are surrounded by residues of cut laminate blocks 411. The residues of the cut laminate blocks 411 are electrically independent of other electrical circuits, and do not operate as laminate blocks 430 themselves, but have a part of the structure which is the same as an adjacent pixel block 210 or circuit block 220.

Thereby, in the image-capturing element 423, pixel cells 217 to not operate are disposed further outside pixel cells 217 that are among pixel cells 217 to operate and are positioned at the outermost circumference. Accordingly, the pixel cells 217 to operate at the outermost circumference of the image-capturing element 423 are never deformed due to cutting. Furthermore, although if an outer pattern is different from an inner pattern, shapes may be distorted due to the influence of the difference between the patterns at the time of exposure in some cases, the uniformity of the shapes of pixels at the time of exposure is maintained in the image-capturing element 423 because pixel cells 217 are arranged side by side in the same pattern. In addition, because of the presence of pixel cells 217 to not operate at outer portions, the non-uniformity of the quantity of light generated by diffused reflection at the image-capturing element is reduced so that differences in the conditions of reception of incident light at pixel cells 217 to operate at the outermost circumference and pixel cells 217 at the middle of the image-capturing element 423 can be reduced. Accordingly, the uniformity of image quality is maintained even at every corner of the image-capturing element 423.

Fringe portions which are given oblique lines in the figure indicate residues of the cut laminate blocks 411 when the image-capturing element 423 is cut out from the laminate substrate 401. These portions include partial structures that are the same as portions of the structure of an adjacent uncut pixel block 210 or circuit block 220, the portions being located opposite to the laminate blocks 411.

Figure 10:
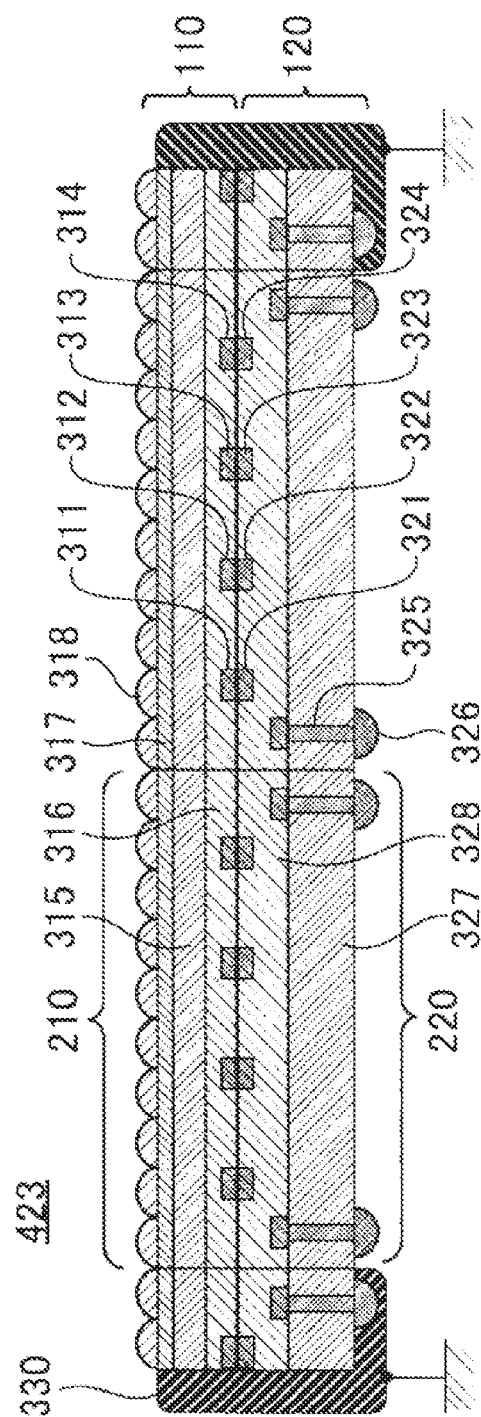
FIG. 10 is a sectional view of the image-capturing element 423.

FIG. 10 is a schematic sectional view of the image-capturing element 423. In the illustrated image-capturing element 423, residues of cut laminate blocks 411 that are remaining on the image-capturing element 423 are coated by a conductor layer 330. In addition, the conductor layer 330 is connected to a reference potential such as ground. The potential may be supplied from a printed substrate or the like. Furthermore, the conductor layer 330 may be at the same potential with the first substrate 110 or may be electrically open. In addition, desirably, portions of the first substrate 110 at which it is cut are electrically linked with the conductor layer 330, and the cut laminate blocks 411 are at the same potential with it.

In the image-capturing element 423 cut out from the laminate substrate 401, the outer circumferential surface is formed by cut pixel blocks 210 or circuit blocks 220. Because of this, in the state where it is just cut out from the laminate substrate 401 and no further processing is performed thereon, conductor layers or the like forming pixel blocks 210 and circuit blocks 220 are exposed to the side surface of the image-capturing element 423.

In view of this, as mentioned above, unexpected operation of elements, wires or the like remaining at the outer circumference of the image-capturing element 423 is prevented by coating, with a conductive adhesive or the like, the conductor layer 330 that grounds the side surface of the image-capturing element 423. Thereby, the reference potential of the image-capturing element 423 is stabilized, and additionally the circumference of the image-capturing element 423 is shielded from electromagnetic waves so that operation as the image-capturing element 423 is stabilized. In addition, instead of the conductor layer 330, the side surface of the image-capturing element 423 may be coated with an insulating adhesive or the like and made exposed and open.

Figure 11:
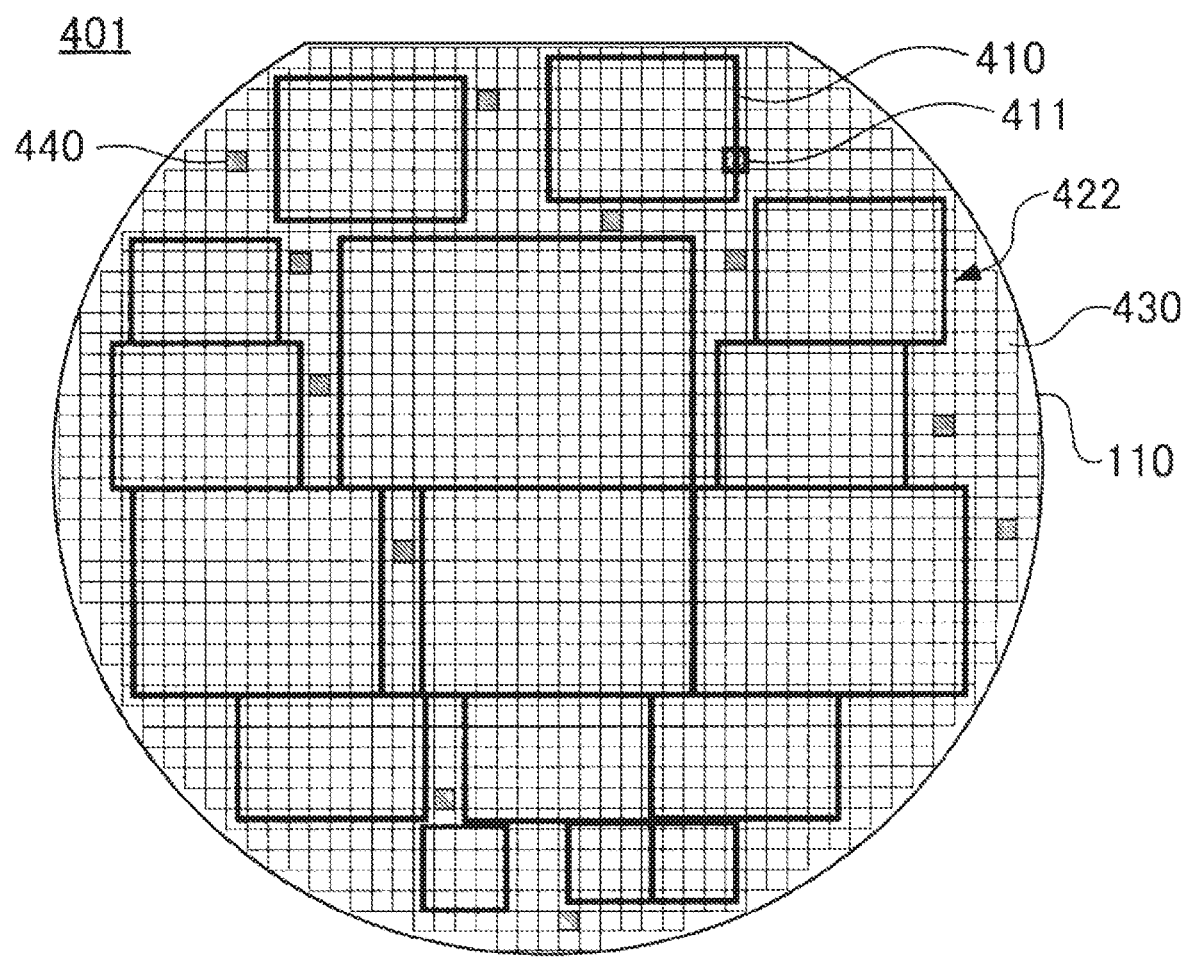
FIG. 11 is a figure schematically showing cut-out positions of the image-capturing elements 422.

FIG. 11 is a figure schematically showing other cut-out positions of the image-capturing elements 422 in the laminate substrate 401. In the process of preparing the first substrate 110 and second substrate 120 by forming each of a number of pixel blocks 210 and a number of circuit blocks 220 on one substrate, defective blocks 440 may be generated on each substrate.

In view of this, pixel blocks 210 and circuit blocks 220 are inspected individually to detect defective blocks before the step of cutting out image-capturing elements 422 from the laminate substrate 401, and a step of determining cut-out positions for image-capturing element 422 so that the defective blocks 440 are not included therein may be provided before the step of cutting out the image-capturing elements 422. Thereby, the yield of the image-capturing elements 422 can be improved. If conditions allow, the usage efficiency of the laminate substrate 401 can be improved by using the defective blocks 440 as blocks to be cut when the image-capturing elements 422 are cut out.

Figure 12:
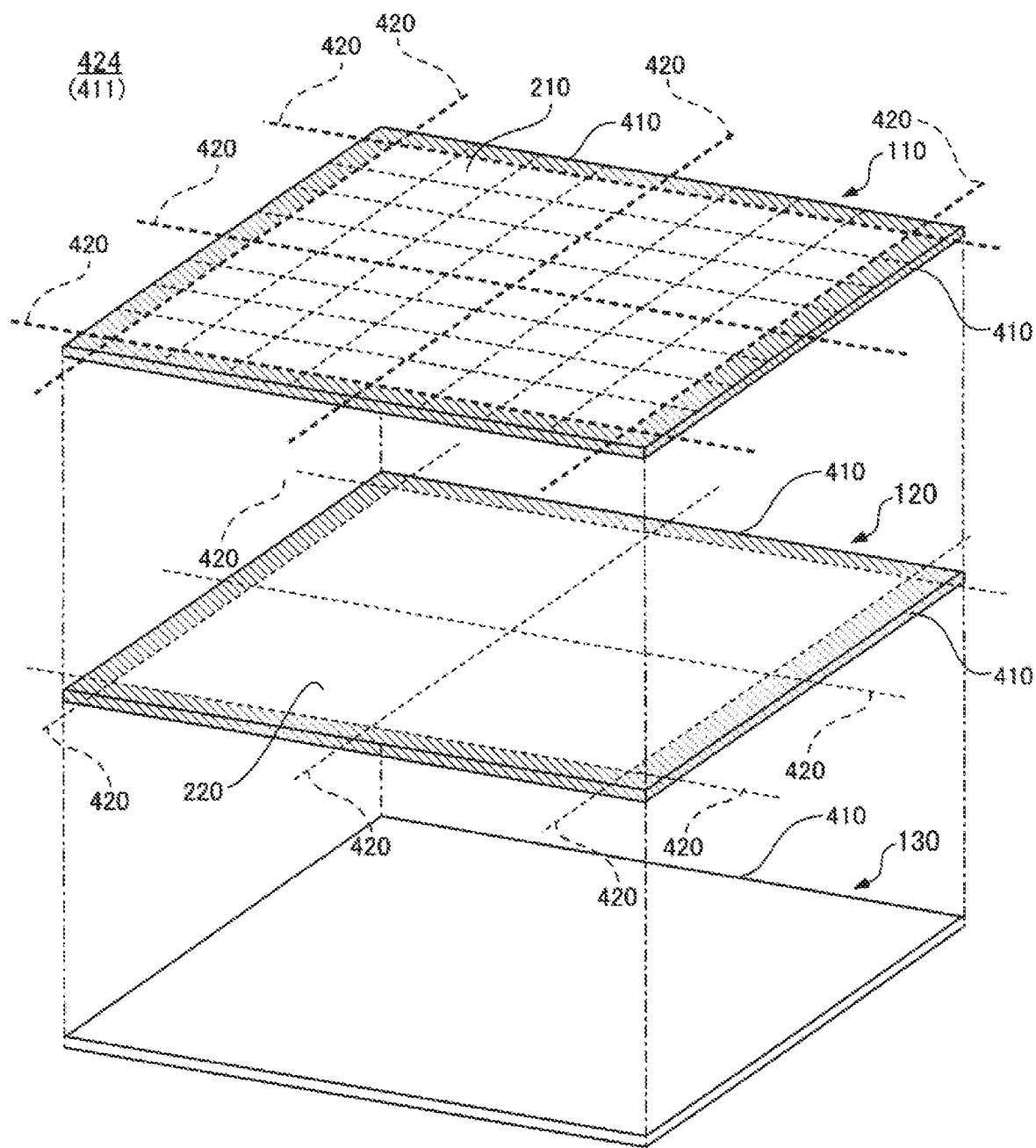
FIG. 12 is a schematic exploded perspective view of an image-capturing element 424.

FIG. 12 is a schematic exploded perspective view of still another image-capturing element 424. The image-capturing element 424 is manufactured by being cut out from a laminate substrate which is a laminate of three layers of substrates including the first substrate 110 and second substrate 120 and additionally a third substrate 130. Note that the laminate substrate to be used when manufacturing the image-capturing element 424 is cut out from a laminate substrate which is a laminate of the first substrate 110 having a plurality of pixel blocks 210, the second substrate 120 having a plurality of circuit blocks 220 and the third substrate 130 having a continuous large region corresponding to the plurality of circuit blocks 220 in the second substrate 120.

As indicated with dotted lines in the figure, in the image-capturing element 424 also, outside boundaries 420 at fringe portions, there are portions where structures which are the same as pixel blocks 210 or circuit blocks 220 are repeatedly arranged in each layer of the first substrate 110 and the second substrate 120. Accordingly, the side surface of the image-capturing element 424 may be coated with an insulating layer or a conductor layer coupled to a ground.

Figure 13:
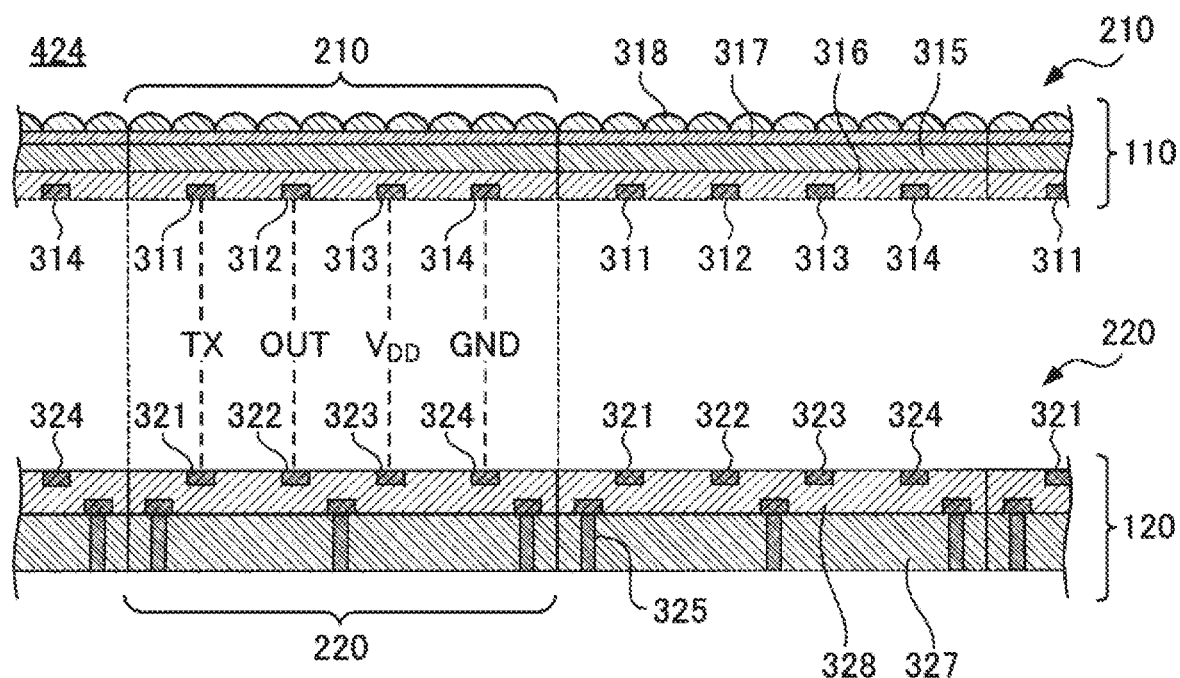
FIG. 13 is a schematic exploded sectional view of the image-capturing element 424.
Figure 13:
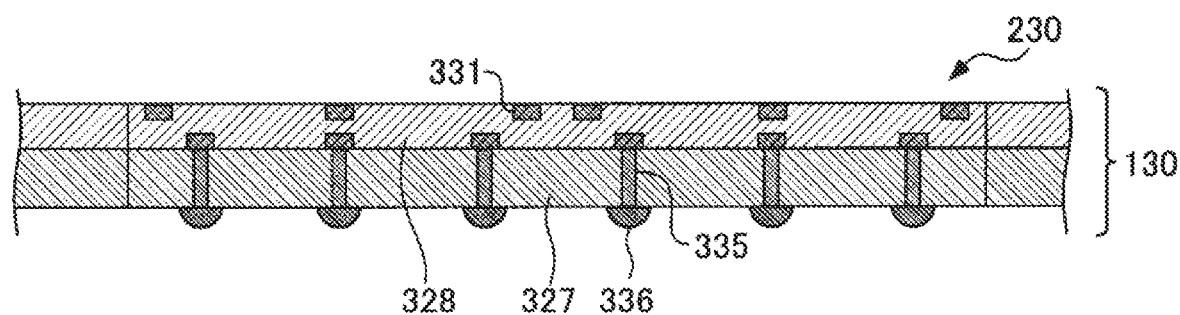

FIG. 13 is an exploded view showing a cross-section of the image-capturing element 424. In the image-capturing element 424, connection pads 311, 312, 313, 314 disposed on the lower surface of the first substrate 110 contact connection pads 321, 322, 323, 324 disposed on the upper surface of the second substrate 120 in the figure so that pixel blocks 210 of the first substrate 110 and circuit blocks 220 of the second substrate 120 are electrically coupled. Thereby, a laminate block 430 is formed by each combination of a pixel block 210 and a circuit block 220.

Furthermore, in the image-capturing element 424, the lower end of a TSV 325 in the second substrate 120 contacts a connection pad 331 formed on the upper surface of the third substrate 130 in the figure so that each of the circuit blocks 220 of the second substrate 120 is electrically connected to the third substrate 130. Because the third substrate 130 has a continuous large structure corresponding to the plurality of circuit blocks 220, laminate blocks 430 to operate respectively individually can be controlled collectively by a control circuit disposed in the third substrate.

Accordingly, in the image-capturing element 424, the control circuit that operate in the third substrate 130 controls the plurality of circuit blocks 220 in the second substrate 120. Accordingly, the image-capturing element 424 can be used entirely as if it is a single image-capturing element not divided into laminate blocks.

In addition, in the image-capturing element 424, pixel blocks 210 formed in one first substrate 110 are driven and controlled by circuits provided to both the second substrate 120 and the third substrate. Accordingly, the scale of the circuits can be expanded to realize an image-capturing element 424 additionally having functions such as image processing functions.

The third substrate 130 has TSVs 335 penetrating it in the thickness direction and bumps 336 provided at lower ends of the TSVs 335 in the figure. Thereby, the image-capturing element 424 including the third substrate 130 can be used by being electrically connected to the outside.

Figure 14:
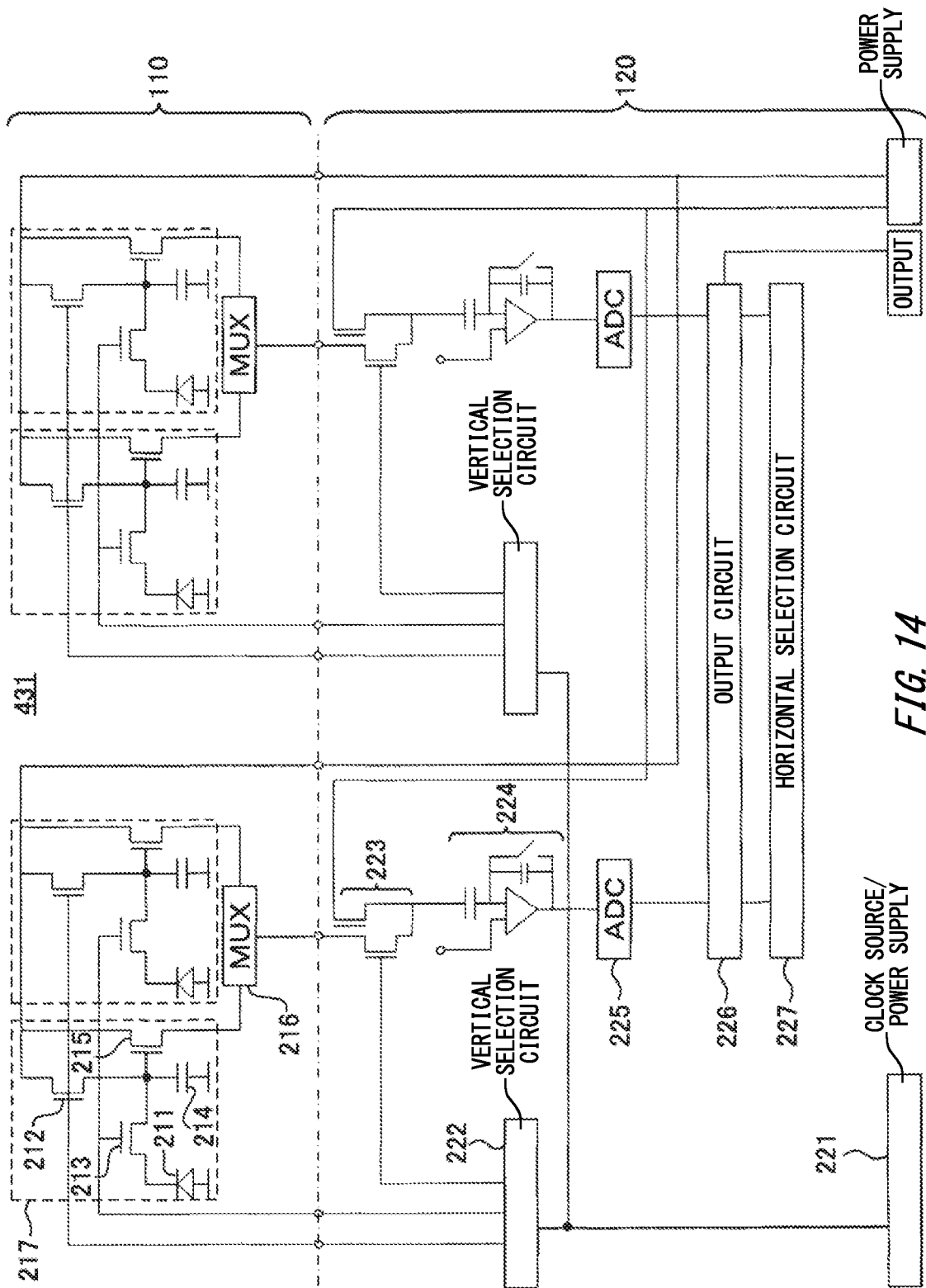
FIG. 14 is a block diagram of a laminate block 431.

FIG. 14 is a block diagram of a laminate block 431 fabricated by being cut out from the laminate substrate 401. Elements that are common to those in other figures are given the same reference numbers, and the same explanations are not repeated.

The laminate block 431 has, in the first substrate 110, a MUX 216 (multiplexer) that connects one of a plurality of pixel cells 217 selectively to the second substrate 120. Thereby, the scale of a circuit in the second substrate 120 relative to the number of the pixel cells 217 can be reduced to simplify the structure of the laminate block 431.

The laminate block 431 includes a readout circuit 223 coupled to an output of the MUX 216 (multiplexer) and an ADC 225 (analog-digital converter). Thereby, in the laminate block 431, an output circuit 226 can perform digital processing on output signals.

Figure 15:
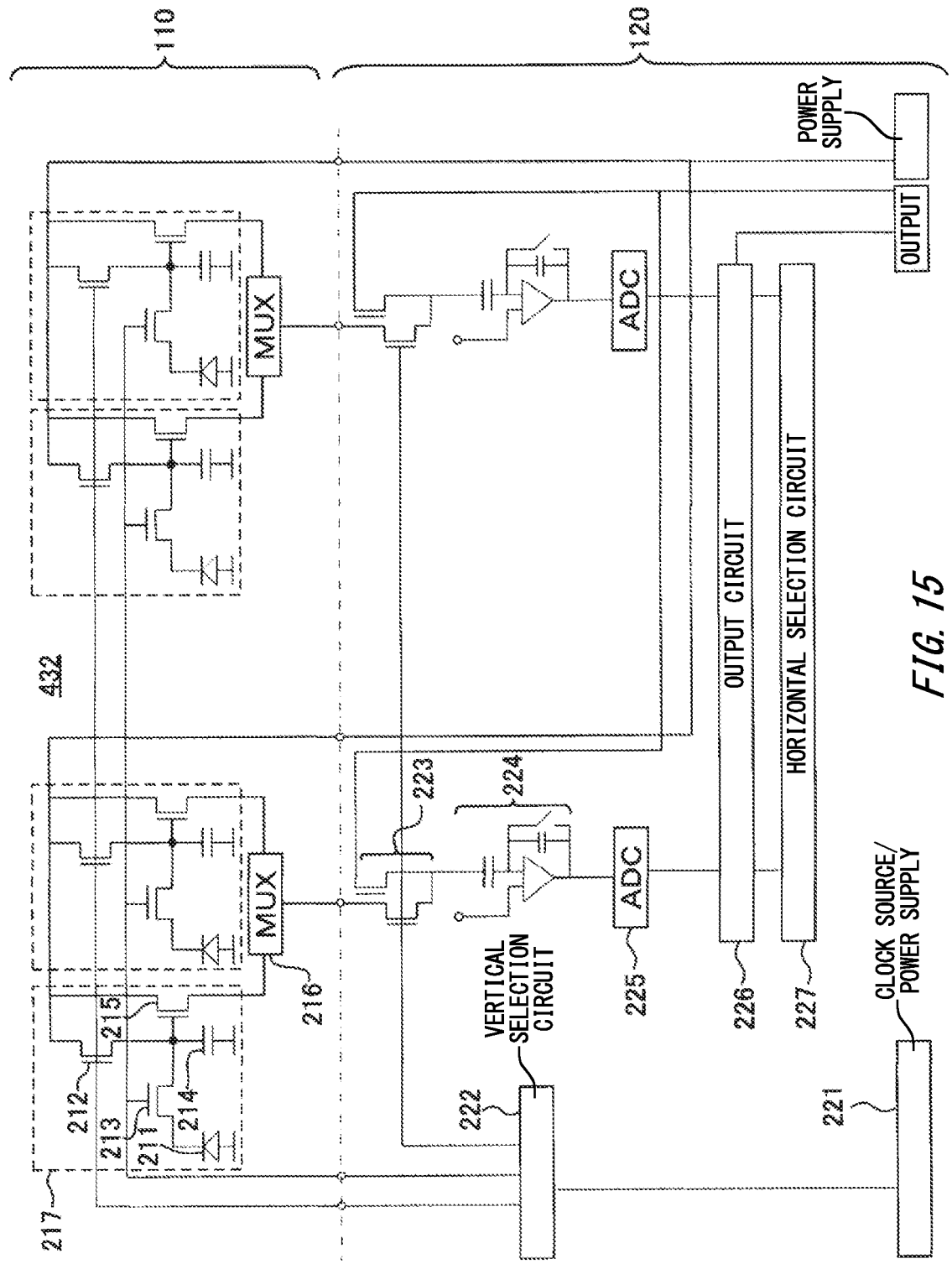
FIG. 15 is a block diagram of a laminate block 432.

FIG. 15 is a block diagram of a laminate block 432 created by being cut out from the laminate substrate 401. Elements that are common to those of the laminate block 431 shown in FIG. 14 are given the same reference numbers, and the same explanations are not repeated.

In the laminate block 432, selection signals output from a vertical selection circuit 222 are supplied to a plurality of readout circuits, and the selection signals are common to the plurality of readout circuits. Thereby, the scale of a circuit in the second substrate 120 relative to the number of the pixel cells 217 can be reduced to simplify the structure of the laminate block 432.

Figure 16:
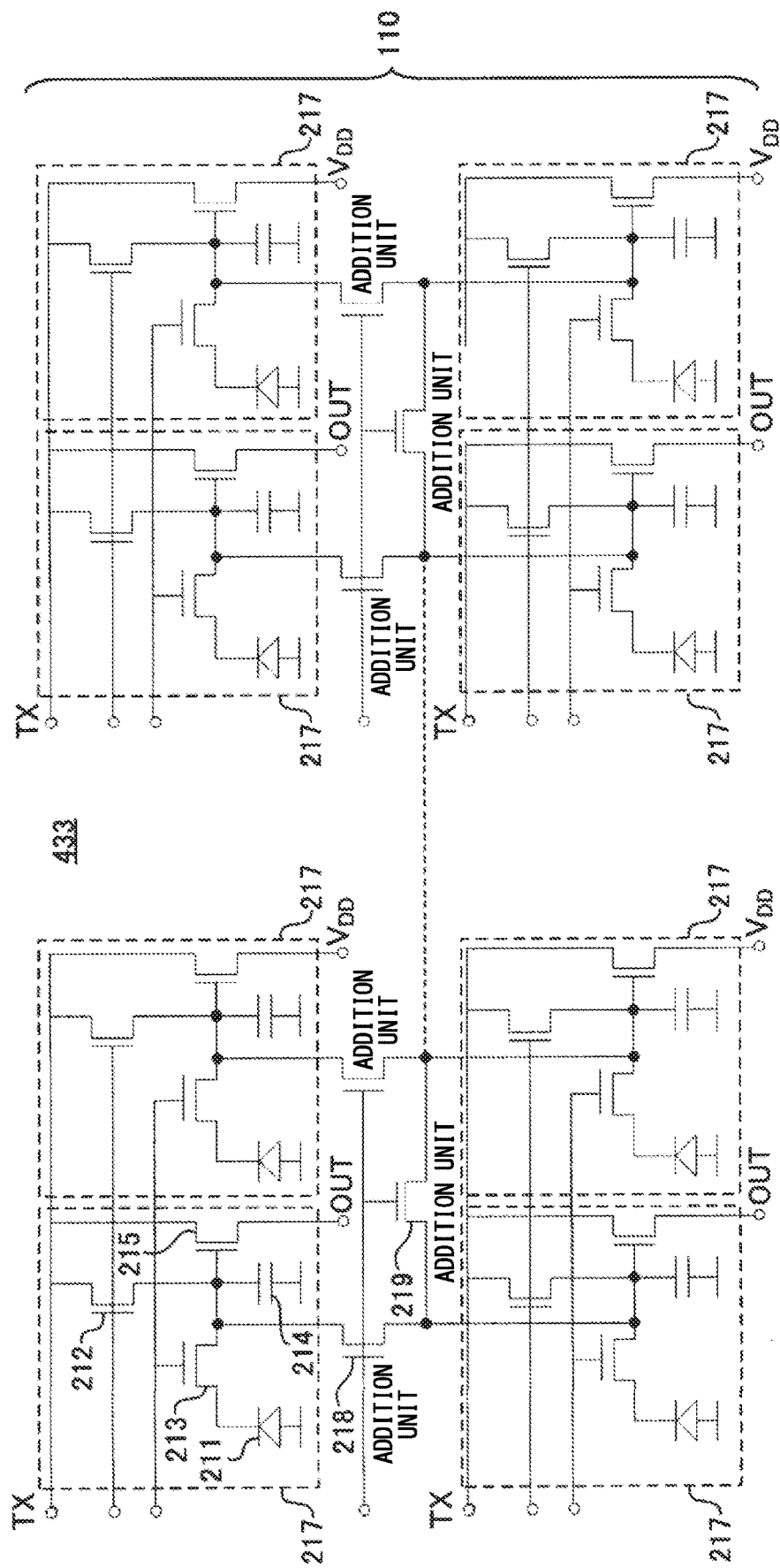
FIG. 16 is a block diagram of a laminate block 433.

FIG. 16 is a block diagram of a laminate block 433. In the figure, pixel cells 217 disposed in the first substrate 110 are shown.

The laminate block 433 includes addition units 218, 219 to receive outputs of a plurality of the pixel cells 217, and an output of the addition unit 219 is output to the second substrate 120 as an output signal OUT of the first substrate 110. Thereby, in the laminate block 433, selection signals at different timing can be supplied to the plurality of pixel cells 217 and the plurality of pixel cells 217 can be used individually as pixels, without operating the addition units 218, 219.

In addition, in the laminate block 433, outputs of the plurality of pixel cells 217 can be added and output at two steps by making the addition units 218, 219 active individually. Thereby, the resolution of the pixel cells 217 in the first substrate 110 can be changed so that the resolution of the laminate block 433 can be changed, separately from the setting of the resolution based on the sizes of image-capturing elements 422 to be cut out from the laminate substrate 401. In addition, by adding outputs of the plurality of pixel cells 217, the light-reception sensitivity as the laminate block 433 can also be improved.

Stated differently, in addition to being able to perform cutting out at any number of pixels or in any size from the laminate substrate 401, image-capturing elements 422 can be manufactured for which any number of pixels and any size are selected, by providing the addition units. The cell size is desirably set small, and for example to 1 µm.

In addition, if the addition units 218, 219 are provided, the number of pixels of a block is desirably as explained below, assuming that they are added in units of N×N. That is, assuming that any combination of numbers of pixels among two to nine pixels, that is, two, three, four, five, six, seven, eight and nine pixels are added together, a number N of pixels of one side of pixels arranged in a matrix form may be a multiple of the least common multiple of numbers including two or more of them. For example, if it assumed that all among two to six pixels are added together, the number of pixels in the block is a multiple of 60 pixels. Furthermore, in order to be capable of coping with nine pixels, it is a multiple of 90 pixels. Thereby, pixels can be used and added efficiently with no extra unused pixels at end portions. The addition units 218, 219 may be provided not to the first substrate 110, but to the second substrate 120 or third substrate 130, and may be provided to an external substrate connected to the image-capturing element. In particular, in the case of a configuration in which the first substrate 110 is not provided with pixel blocks 210, it is necessary for respective pixel cells 217 to be independent so that the addition units 218, 219 are arranged on a substrate other than the first substrate 110.

Figure 17:
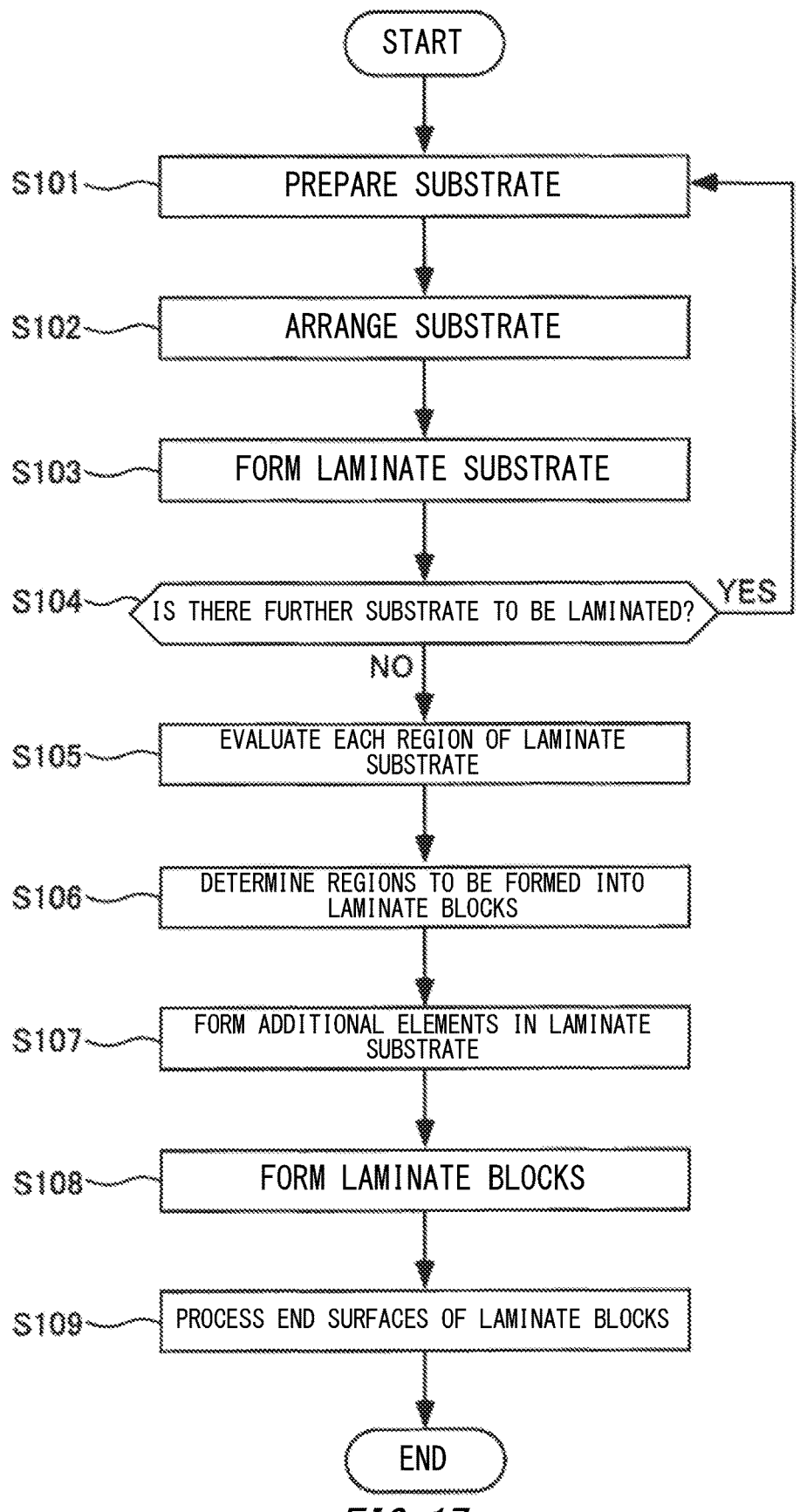

FIG. 17 is a flow diagram illustrating a procedure of manufacturing laminate blocks 430 like the above-mentioned image-capturing element. If the laminate blocks 430 are to be manufactured, first, a plurality of substrates like the first substrate 110 and second substrate 120 are prepared (Step S101).

If a prepared substrate is the first one of substrates at Step S101, the substrate is arranged on one stage of a laminating apparatus or the like (Step S102). In addition, if a prepared substrate is the second one of the substrates at Step S101, the substrate is arranged to face the first one of the substrates (Step S102).

Then, the first one of the substrates which is for example the first substrate 110 and the second one of the substrates which is for example the second substrate 120 are laminated one on another to form the laminate substrate 401 (Step S103). At Step S103, the process of forming the laminate substrate 401 may include positioning of the two substrates and laying them one on another, and causing the substrates to adhere to each other. The adhesion of the substrates may be achieved by bringing mirror-finished and flattened surfaces into contact with each other or by heating and applying pressure to the substrates being laid one on another. Furthermore, an adhesive, solder bumps or the like may be used for the adhesion.

At the next step, it is checked whether or not there is a further substrate to be laminated on the formed laminate substrate 401 (Step S104). If there is a further substrate to be laminated (Step S104: YES), the substrate to be laminated is further prepared (Step S101), and the substrate is arranged to face the existing laminate substrate 401 (Step S102). Then, the third substrate is laminated onto the existing laminate substrate 401 (Step S103). Thereafter, Step S101 to Step S103 are repeated until there are no further substrates to be laminated.

On the other hand, if there are no further substrates to be laminated at Step S104 (Step S104: NO), the quality of circuits formed in the laminate substrate 401 is evaluated for each region of the laminate substrate 401 (Step S105). If the number of laminated layers of the substrate is known in advance, the determination at Step S104 may be omitted, and Step S105 may be executed after Step 101 to Step S103 are repeated a predetermined number of times.

Other than evaluation of the quality of individual circuits formed in each of the first substrate 110, the second substrate 120 and the like, the evaluation at Step S105 may include the quality of circuits formed by being connected in the laminate substrate 401. Thereby, defective locations in the laminate substrate 401 are detected. In results of detection at Step S105, the inspection precision and recording precision may be changed depending on required specifications about the laminate blocks 430 to be finally obtained. In addition, the evaluation such as evaluation of individual substrates may be omitted partially or entirely.

At the next step, regions to be formed into the laminate blocks 430 in the laminate substrate 401 is determined referring to the results of evaluation at Step S105 (Step S106). Here, the regions to be formed into the laminate blocks 430 may be regions completely free of defective locations or may be regions including defective locations to a predetermined degree. In addition, here, in addition to the sizes of the regions to be formed into the laminate blocks 430, the shapes of the laminate blocks 430 to be formed, for example the aspect ratios, may be determined. Furthermore, even if for example initially planned image sensors cannot be obtained from the laminate blocks 430, but if laminate blocks 430 as line sensors can be obtained therefrom, another use of the laminate substrate 401 may be suggested.

At the next step, additional elements are formed in the laminate substrate 401 (Step S107). The additional elements formed at Step S107 may include any of, for example, a wiring layer added to the surface of the laminate substrate 401, electrical elements such as heat sinks, and optical elements such as a color filter or a micro lens array. In addition, a step of implementing another circuit chip or the like to be used when the laminate substrate 401 became laminate blocks 430 may be added.

At the next step, laminate blocks 430 are formed from the laminate substrate 401 (Step S108). The laminate blocks 430 may be formed by cutting the laminate substrate 401 around regions determined at Step S106. Various methods can be applied to cutting of the laminate substrate 401 as explained already.

At Step S108, at each of the first substrate 110 and second substrate 120 forming the laminate substrate 401, pixels and circuit blocks disposed around regions to be laminate blocks 430 are cut. Accordingly, when regions to be laminate blocks 430 are determined at Step S106, they may be determined as regions adjacent to regions detected as being defective at Step S105. Thereby, the number of good quality pixels or circuit blocks to be lost by cutting for forming the laminate blocks 430 at Step S108 can be reduced.

At the next step, end surfaces of the formed laminate blocks 430 that appeared after cutting the laminate substrate 401 at Step S108 are processed (Step S109). As explained already, at Step S108, pixels, circuit blocks or the like in the laminate substrate 401 are cut. Because of this, parts of circuits, wires or the like are exposed at the cut end surfaces of the laminate blocks 430 in some cases. Accordingly, for the purpose of preventing inadvertent short-circuiting or the like, the cut end surfaces of the laminate blocks 430 may be processed by coating with an insulating material, a conductive material or the like.

In addition, for the purpose of preventing cracks or the like due to irregularity of the cut end surfaces, the cut end surfaces of the laminate blocks 430 may be protected by resin, solder, glass or the like. Note that processing of the cut end surfaces of the laminate blocks 430 at Step S109 is unnecessary in some cases. In such cases, Step S109 may be omitted.

A series of procedures like the ones mentioned above may be executed in a manufacturing apparatus including a laminating unit that positions and laminates a plurality of substrates one on another and a cutting unit that cuts a laminate substrate formed by the laminating unit. In addition, it may be executed by an existing substrate laminating apparatus that positions and laminates a plurality of substrates one on another and an existing cutting apparatus that can cut the laminated substrates, respectively. In addition, the above-mentioned procedures may be executed by providing a laminating unit and a cutting unit in a manufacturing line for image-capturing elements with laminate structures, for example, back-side illumination image sensors. The above-mentioned manufacturing procedures are one example, and are not the sole example.

Figure 18:
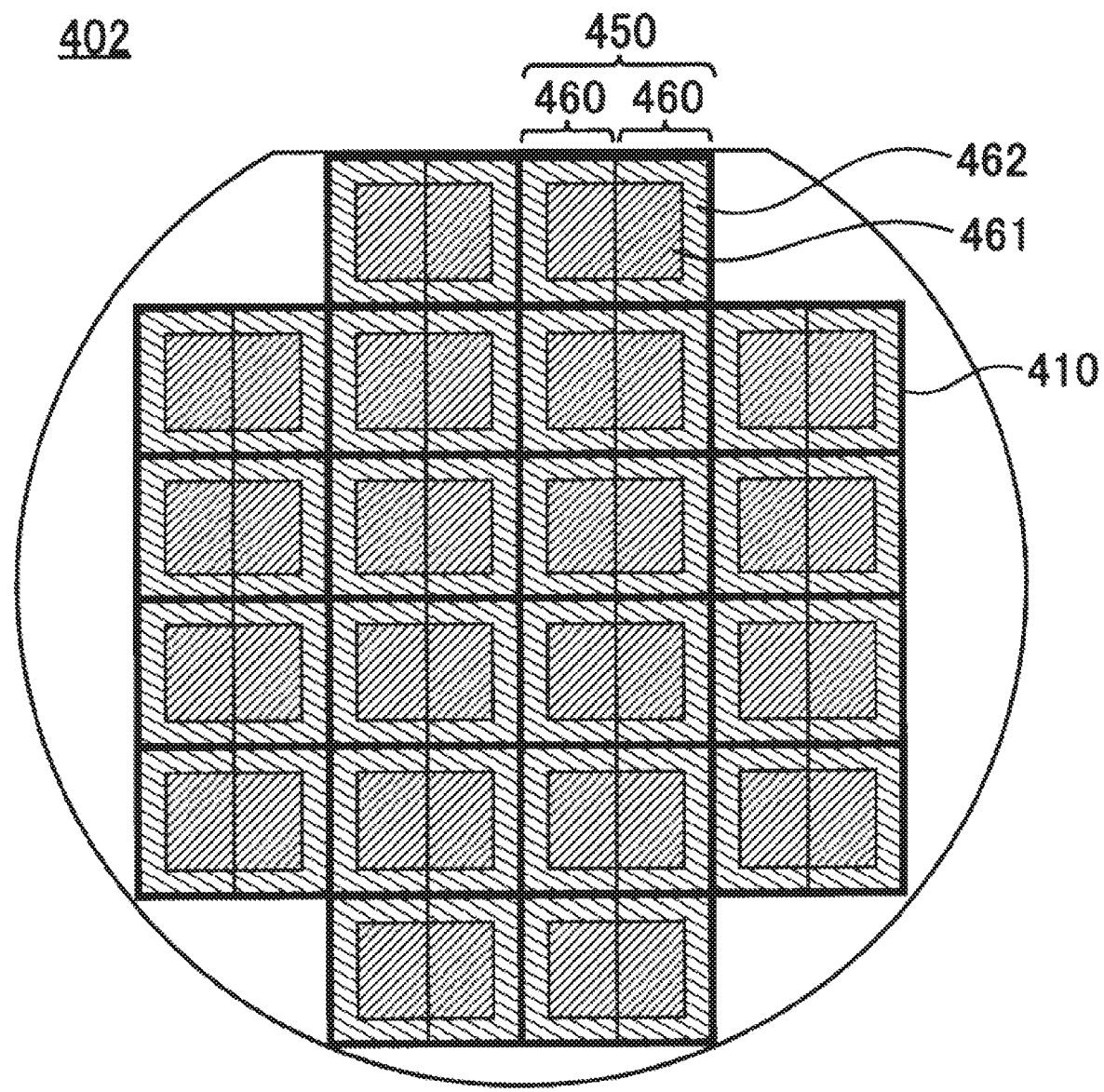
FIG. 18 is a schematic view of a single layer substrate 402.

FIG. 18 is a schematic view of a single layer substrate 402. The single layer substrate 402 has a plurality of image-capturing element units 450 that are two-dimensionally arrayed in the plane direction of the substrate. Each of the image-capturing element units 450 has a pixel cell region 461 and a readout circuit region 462.

In each of the image-capturing element units 450, the pixel cell region 461 has a plurality of pixel cells 217 that are two-dimensionally arrayed in the plane direction of the single layer substrate 402. Each of the pixel cells 217 has a light-receiving element and performs photoelectric conversion of incident light.

In addition, the readout circuit region 462 is disposed outside the pixel cell region 461 in the plane direction of the single layer substrate 402 to surround the pixel cell region 461. The readout circuit region 462 reads out electric signals corresponding to incident light from the pixel cell region 461.

Furthermore, each of the pixel cell regions 461 and each of the readout circuit regions 462 in each of the image-capturing element units 450 form a pair of image-capturing element blocks 460 divided at the middle in the horizontal direction in the figure. Each of the pixel cell regions 461 and readout circuit regions 462 individually has connection terminals to a power supply, a ground or the like, and operates mutually independently between a pair of the image-capturing element blocks 460.

The above-mentioned single layer substrate 402 becomes a plurality of image-capturing elements by being cut in units of image-capturing element units 450 along cut-out lines 410. Furthermore, the single layer substrate 402 may provide slices formed by cutting out regions including the boundaries of image-capturing element blocks 460, and the slices can be used as image-capturing elements smaller than image-capturing element units 450.

Figure 19:
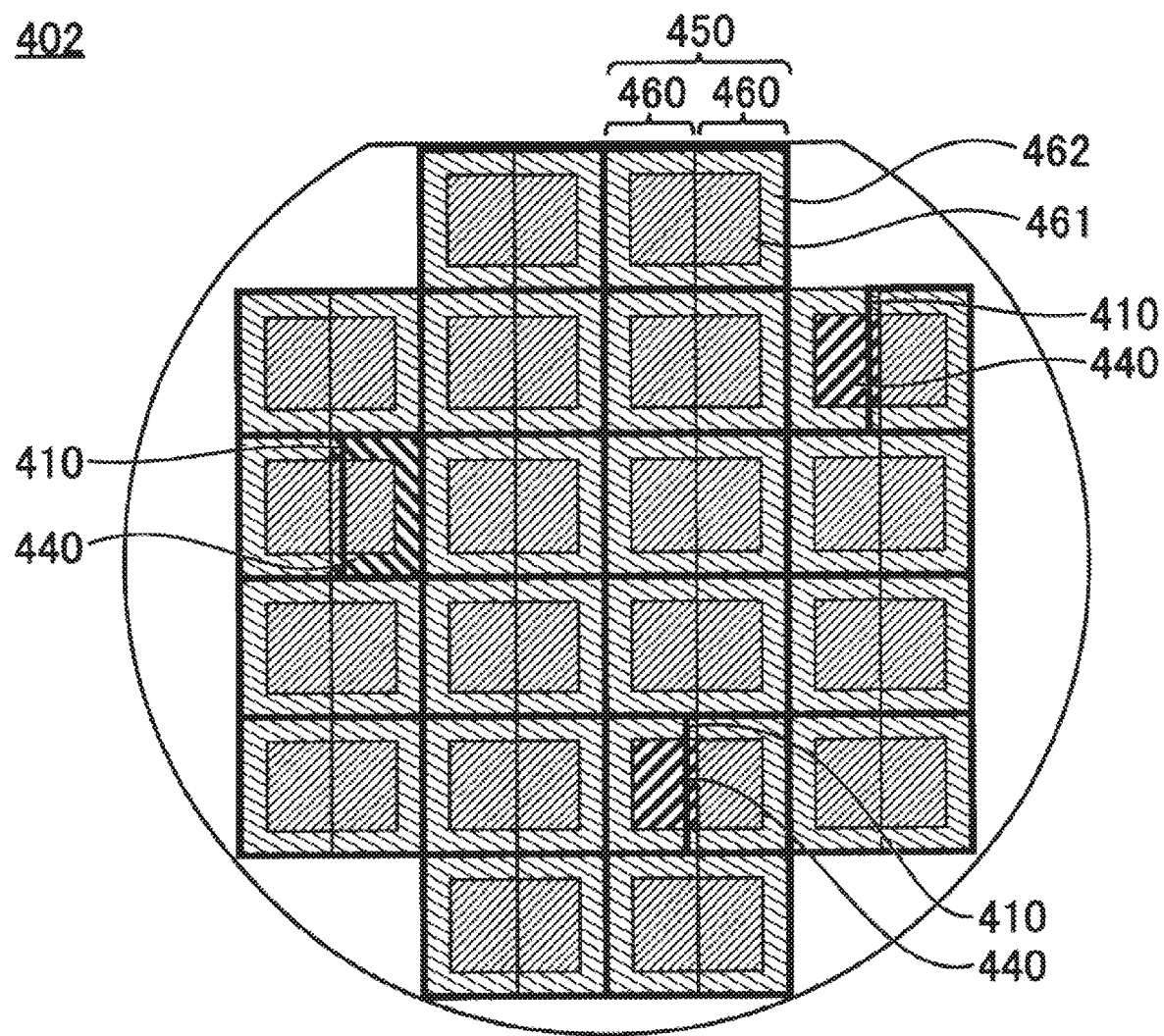
FIG. 19 is a schematic view illustrating how to use the single layer substrate 402.

FIG. 19 is a schematic view showing one example of a dicing pattern to be used when the single layer substrate 402 is cut into pieces. As illustrated, an image-capturing element block 460 including a pixel cell region 461 and a readout circuit region 462 one of which is detected as being defective as a result of inspection of the single layer substrate 402 before being cut into pieces is purged as a defective block 440 before the single layer substrate 402 is cut into pieces.

However, if one of image-capturing element blocks 460 included in one image-capturing element unit 450 is a defective block 440 and the other one is normal, a half of the image-capturing element unit 450 can be used as a normal image-capturing element with a different size by cutting out the normal image-capturing element block 460 along cut-out lines 410 defining a region inside which the boundary between the image-capturing element blocks 460 is included. Thereby, the usage efficiency of the single layer substrate 402 can be improved.

Figure 20:
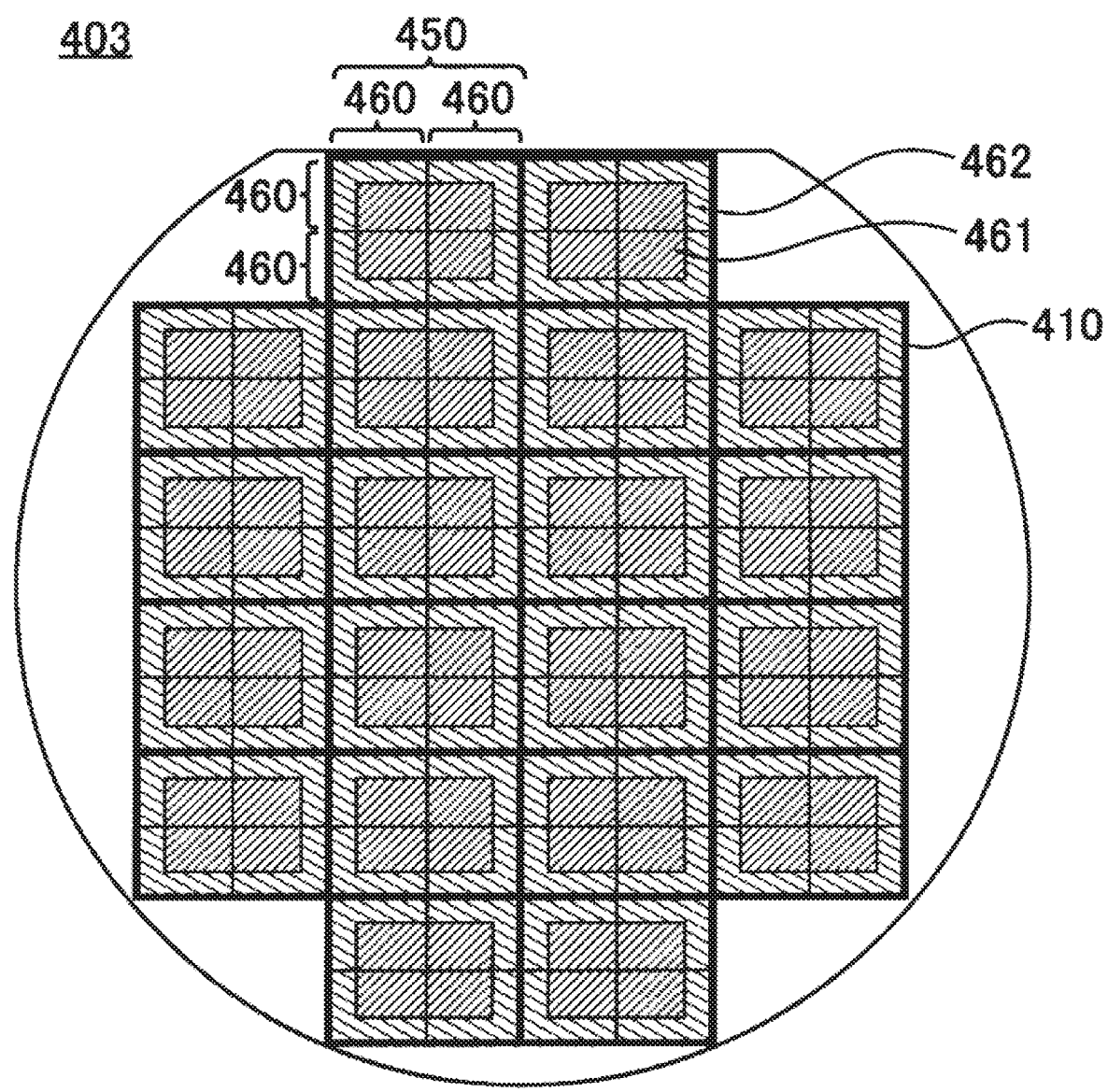
FIG. 20 is a schematic view of a single layer substrate 403.

FIG. 20 is a schematic view of another single layer substrate 403. The single layer substrate 403 has a structure which is the same as that of the single layer substrate 402 shown in FIG. 18 and FIG. 19 in other respects than those explained next. Accordingly, common elements are given the same reference numbers, and the same explanations are not repeated.

The single layer substrate 403 is different from the single layer substrate 402 in terms of structure in that each of pixel cell regions 461 and readout circuit regions 462 in each of image-capturing element units 450 is divided at the middle in the horizontal direction and vertical direction in the figure, and each of the image-capturing element units 450 is divided into four image-capturing element blocks 460. Each of the pixel cell regions 461 and readout circuit regions 462 forming an image-capturing element block 460 individually has connection terminals to a power supply, a ground or the like, and operates mutually independently of another image-capturing element block 460.

The above-mentioned single layer substrate 403 becomes a plurality of image-capturing elements by being cut in units of image-capturing element units 450 along cut-out lines 410. Furthermore, the single layer substrate 403 may provide slices formed by cutting out regions including the boundaries of image-capturing element blocks 460, and the slices can be used as image-capturing elements smaller than image-capturing element units 450.

Figure 21:
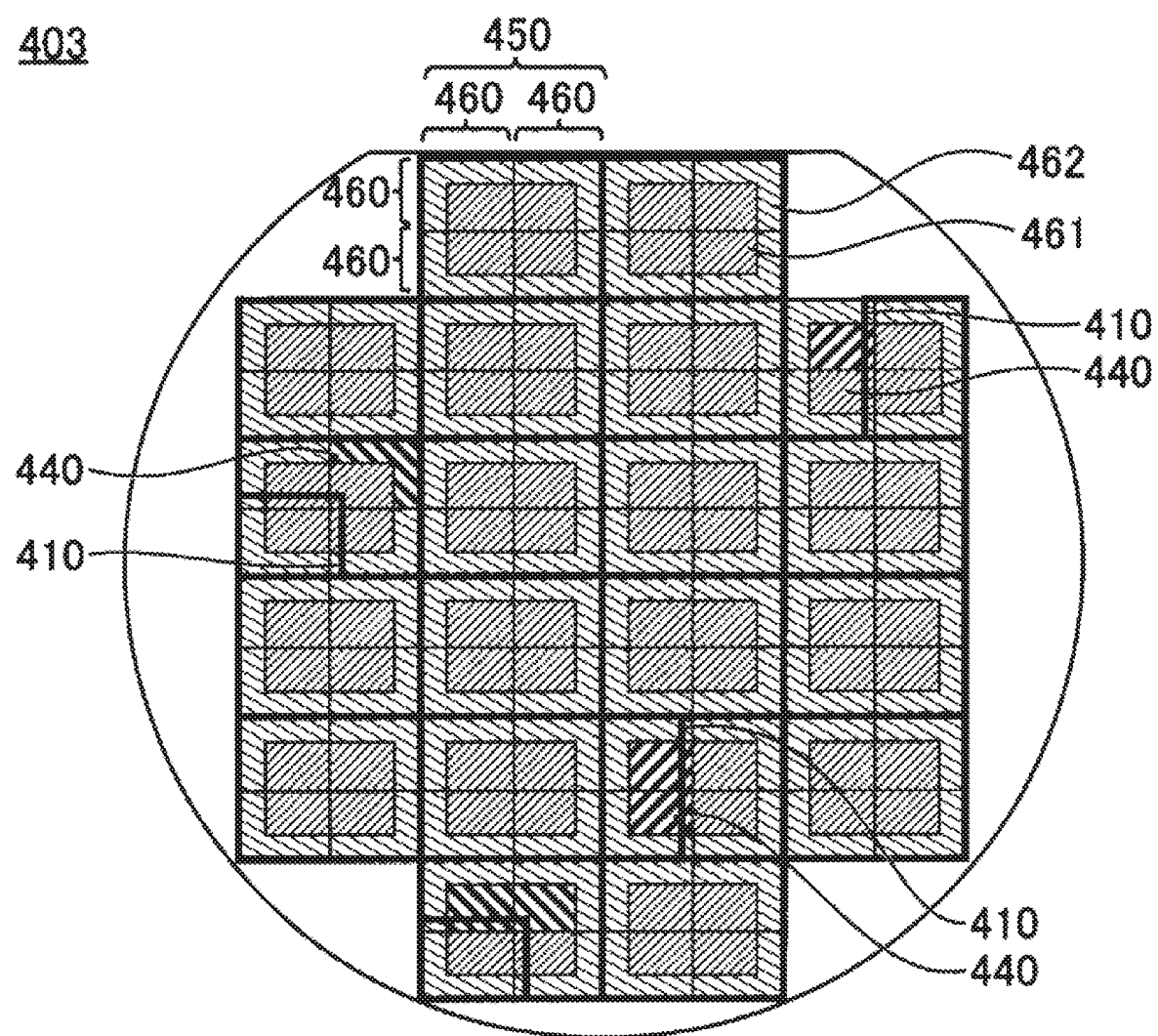
FIG. 21 is a schematic view illustrating how to use the single layer substrate 403.

FIG. 21 is a schematic view showing one example of a dicing pattern to be used when the single layer substrate 403 is cut into pieces. As illustrated, an image-capturing element block 460 including a pixel cell region 461 and a readout circuit region 462 one of which is detected as being defective as a result of inspection of the single layer substrate 403 before being cut into pieces is purged as a defective block 440 before the single layer substrate 402 is cut into pieces.

In this manner, even in a monolithic structure, image-capturing elements with various sizes can be cut out in block units by providing a plurality of blocks to operate electrically and mutually independently. In addition, the usage efficiency of a substrate in the case where defective blocks are purged can be improved, by making the sizes of image-capturing elements to be cut out from one substrate different from each other.

Figure 22:
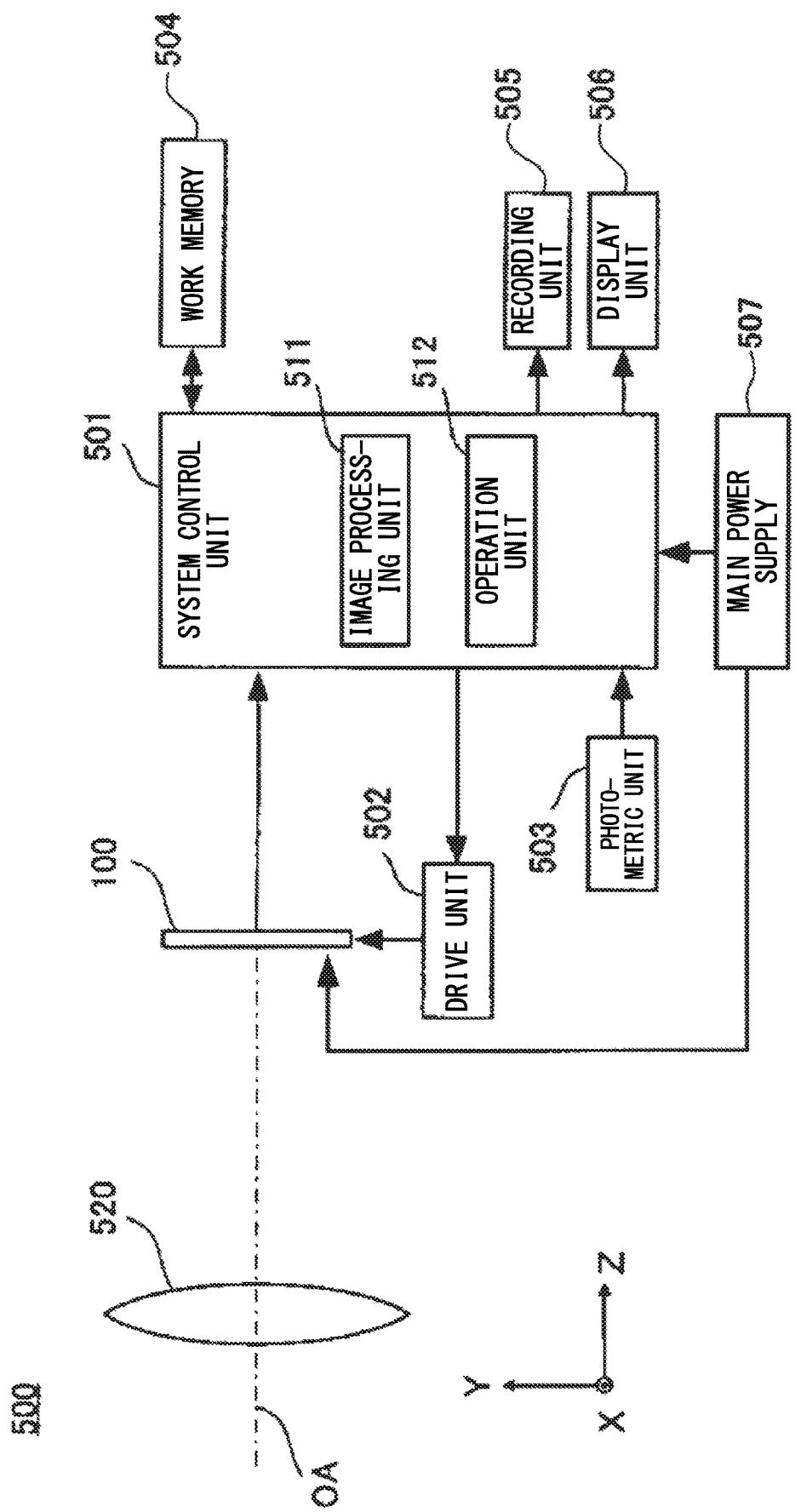
FIG. 22 is a block diagram of an image-capturing device 500.

FIG. 22 is a block diagram of an image-capturing device 500 using an image-capturing element 100 having the laminate blocks 430 to 433. The image-capturing device 500 includes the image-capturing element 100, a system control unit 501, a drive unit 502, a photometric unit 503, a work memory 504, a recording unit 505, a display unit 506 and a main power supply 507. In addition, the image-capturing device 500 includes an image-capturing lens 520 as an image-capturing optical system. The image-capturing lens 520 may be a replaceable lens that can be attached to and detached from the image-capturing device 500.

The image-capturing lens 520 guides a subject luminous flux that enters there along an optical axis OA to the image-capturing element 100. The image-capturing lens 520 is constituted by a plurality of optical lens groups, and forms an image of subject luminous fluxes from a scene onto the vicinity of its focal plane. The image-capturing lens 520 is representatively shown as one imaginary lens arranged near the pupil in the figure.

The drive unit 502 is a control circuit that executes electrical charge storage control such as timing control, region control or the like of the image-capturing element 100 according to instructions from the system control unit 501. It can be said that the drive unit 502 is in charge of the function of an image-capturing element control unit that causes the image-capturing element 100 to execute electrical charge storage and to output pixel signals.

The image-capturing element 100 passes an pixel signal to the image processing unit 511 of the system control unit 501. The image processing unit 511 performs various image processing by using the work memory 504 as a work space, and generates image data. For example, when generating image data in the JPEG file format, color picture signals are generated from signals obtained in a Bayer array, and thereafter compression is executed thereon. Generated image data is recorded in the recording unit 505, and additionally is converted into display signals to be displayed on the display unit 506 for a preset length of time. The main power supply 507 supplies power to each unit of the image-capturing device 500. Destinations of power supply from the main power supply 507 include the image-capturing element 100.

The photometric unit 503 detects the luminance distribution of a scene prior to a series of image-capturing sequences to generate image data. The photometric unit 503 includes an AE sensor of approximately one million pixels, for example. The operation unit 512 of the system control unit 501 receives an output of the photometric unit 503 to calculate the luminance of each region of a scene. The operation unit 512 determines the shutter speed, F-number and ISO speed according to the calculated luminance distribution. The image-capturing element 100 may double as the photometric unit 503. The operation unit 512 executes various types of operations for causing the image-capturing device 500 to operate.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS 100, 421, 422, 423, 424, 425: image-capturing element; 110: first substrate; 120: second substrate; 130: third substrate; 210: pixel block; 211: light-receiving element; 212: reset transistor; 213: transfer transistor; 214: capacitive element; 215: amplifier transistor; 216: MUX; 217: pixel cell; 218, 219: addition unit; 220: circuit block; 221: clock source/power supply; 222: vertical selection circuit; 223: readout circuit; 225: ADC; 226: output circuit; 227: horizontal selection circuit; 311, 312, 313, 314, 321, 322, 323, 324, 331: connection pad; 315: underlying substrate; 316, 328: circuit layer; 317: color filter; 318: micro lens array; 325, 335: TSV; 326, 336: bump; 330: conductor layer; 401: laminate substrate; 402, 403: single layer substrate; 410: cut-out line; 411, 430, 431, 432, 433: laminate block; 420: boundary; 440: defective block; 450: image-capturing element unit; 460: image-capturing element block; 461: pixel cell region; 462: readout circuit region; 500: image-capturing device; 501: system control unit; 502: drive unit; 503: photometric unit; 504: work memory; 505: recording unit; 506: display unit; 507: main power supply; 511: image processing unit; 512: operation unit; 520: image-capturing lens

What is claimed is:
1. An image-capturing element comprising:
a first substrate having a plurality of pixels that are two-dimensionally continuously arrayed; and
a second substrate that is laminated onto the first substrate and has a plurality of circuit blocks including circuitry to read out signals from the plurality of pixels corresponding to the plurality of circuit blocks,
wherein
the plurality of circuit blocks respectively have connection terminals to a power supply and a reference potential and are electrically independent from each other,
an outermost circumference of at least one first circuit block among the plurality of circuit blocks is surrounded by residue of cut second circuit blocks among the plurality of circuit blocks, and
an outermost circumference of first pixels among the plurality of pixels is surrounded by residue of cut second pixels among the plurality of pixels.

2. The image-capturing element according to claim 1, wherein the second substrate has, at an outer fringe portion thereof, circuitry having the same structure as a portion of the at least one first circuit block and is electrically independent.

3. The image-capturing element according to claim 1, further comprising an addition unit that adds outputs of some of the plurality of pixels.

4. The image-capturing element according to claim 1, wherein
- the first substrate has a plurality of pixel blocks that are respectively laminated corresponding to the plurality of circuit blocks, and
- each of the plurality of pixel blocks has the plurality of pixels disposed in a matrix form, and the number N of the plurality of pixels on one side is a multiple of the least common multiple of at least two of N=2 to 9.

5. The image-capturing element according to claim 1, further comprising a third substrate that:
- has circuitry to drive the plurality of pixels;
- is laminated onto the first substrate and the second substrate; and
- is electrically coupled at least to the first substrate.

6. An image-capturing device comprising the image-capturing element according to claim 1.

7. The image-capturing element according to claim 1, wherein
- the residue of second circuit blocks has the same structure as portions of the at least one first circuit block, and
- the residue of second pixels has the same structure as portions of the first pixels.

8. The image-capturing element according to claim 1, wherein an outside boundary of the residue of second circuit blocks is aligned with an outside boundary of the residue of second pixels.

* * * * *